(12) United States Patent
Kato

(10) Patent No.: US 11,233,055 B2
(45) Date of Patent: Jan. 25, 2022

(54) SEMICONDUCTOR DEVICE

(71) Applicant: Semiconductor Energy Laboratory Co., Ltd., Atsugi (JP)

(72) Inventor: Kiyoshi Kato, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 16/431,778

(22) Filed: Jun. 5, 2019

(65) Prior Publication Data

US 2019/0287974 A1 Sep. 19, 2019

Related U.S. Application Data

(60) Division of application No. 15/722,016, filed on Oct. 2, 2017, now Pat. No. 10,319,723, which is a
(Continued)

(30) Foreign Application Priority Data

Jul. 2, 2010 (JP) ................. 2010-152021

(51) Int. Cl.
*H01L 27/105* (2006.01)
*H01L 27/06* (2006.01)
(Continued)

(52) U.S. Cl.
CPC ...... *H01L 27/1052* (2013.01); *H01L 27/0688* (2013.01); *H01L 27/10805* (2013.01);
(Continued)

(58) Field of Classification Search
CPC .................. H01L 27/1052; H01L 21/7687
See application file for complete search history.

(56) References Cited

U.S. PATENT DOCUMENTS 4,466,081 A 8/1984 Masuoka
4,902,637 A 2/1990 Kondou et al.
(Continued)

FOREIGN PATENT DOCUMENTS

CN 101038919 A 9/2007
EP 1017100 A 7/2000
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Farun Lu
(74) *Attorney, Agent, or Firm* — Fish & Richardson P.C.

(57) ABSTRACT

An object is to provide a semiconductor device with a novel structure in which stored data can be held even when power is not supplied and there is no limit on the number of write operations. The semiconductor device includes a first memory cell including a first transistor and a second transistor, a second memory cell including a third transistor and a fourth transistor, and a driver circuit. The first transistor and the second transistor overlap at least partly with each other. The third transistor and the fourth transistor overlap at least partly with each other. The second memory cell is provided over the first memory cell. The first transistor includes a first semiconductor material. The second transistor, the third transistor, and the fourth transistor include a second semiconductor material.

21 Claims, 20 Drawing Sheets

Related U.S. Application Data continuation of application No. 14/162,837, filed on Jan. 24, 2014, now Pat. No. 9,780,093, which is a continuation of application No. 13/767,904, filed on Feb. 15, 2013, now Pat. No. 8,637,865, which is a continuation of application No. 13/169,544, filed on Jun. 27, 2011, now Pat. No. 8,378,403.

(51) Int. Cl.

| | |
|---|---|
| *H01L 27/11521* | (2017.01) |
| *H01L 27/11551* | (2017.01) |
| *H01L 27/1156* | (2017.01) |
| *H01L 27/12* | (2006.01) |
| *H01L 27/108* | (2006.01) |
| *G11C 16/04* | (2006.01) |
| *G11C 16/08* | (2006.01) |
| *G11C 16/10* | (2006.01) |
| *G11C 16/26* | (2006.01) |

(52) U.S. Cl.
CPC .... *H01L 27/1156* (2013.01); *H01L 27/11521* (2013.01); *H01L 27/11551* (2013.01); *H01L 27/1203* (2013.01); *G11C 16/0433* (2013.01); *G11C 16/08* (2013.01); *G11C 16/10* (2013.01); *G11C 16/26* (2013.01)

(56) References Cited

U.S. PATENT DOCUMENTS

| | | |
|---|---|---|
| 5,112,765 A | 5/1992 | Cederbaum et al. |
| 5,349,366 A | 9/1994 | Yamazaki et al. |
| 5,366,922 A | 11/1994 | Aoki et al. |
| 5,470,776 A | 11/1995 | Ryou |
| 5,675,185 A * | 10/1997 | Chen .................. H01L 27/0688 257/752 |
| 5,731,856 A | 3/1998 | Kim et al. |
| 5,744,864 A | 4/1998 | Cillessen et al. |
| 5,770,483 A * | 6/1998 | Kadosh ............... H01L 21/8221 257/E21.575 |
| 5,796,650 A | 8/1998 | Wik et al. |
| 5,812,231 A | 9/1998 | Kochi et al. |
| 5,851,866 A | 12/1998 | Son |
| 5,936,881 A | 8/1999 | Kawashima et al. |
| 6,127,702 A | 10/2000 | Yamazaki et al. |
| 6,180,957 B1 | 1/2001 | Miyasaka et al. |
| 6,191,442 B1 | 2/2001 | Matsufusa |
| 6,266,269 B1 | 7/2001 | Karp et al. |
| 6,294,274 B1 | 9/2001 | Kawazoe et al. |
| 6,314,017 B1 | 11/2001 | Emori et al. |
| 6,429,484 B1 | 8/2002 | Yu |
| 6,445,026 B1 | 9/2002 | Kubota et al. |
| 6,501,116 B2 | 12/2002 | Kisu et al. |
| 6,515,511 B2 | 2/2003 | Sugibayashi et al. |
| 6,563,174 B2 | 5/2003 | Kawasaki et al. |
| 6,625,057 B2 | 9/2003 | Iwata |
| 6,628,551 B2 | 9/2003 | Jain |
| 6,646,300 B2 | 11/2003 | Ishii et al. |
| 6,717,180 B2 | 4/2004 | Yamazaki et al. |
| 6,727,522 B1 | 4/2004 | Kawasaki et al. |
| 6,787,411 B2 | 9/2004 | Kisu et al. |
| 6,808,965 B1 | 10/2004 | Miyasaka et al. |
| 6,808,971 B2 | 10/2004 | Bhattacharyya |
| 6,825,525 B2 | 11/2004 | Ishii et al. |
| 6,839,260 B2 | 1/2005 | Ishii |
| 6,846,703 B2 * | 1/2005 | Shimoda ............. H01L 21/6835 257/E21.614 |
| 6,933,201 B2 | 8/2005 | Tominari et al. |
| 6,946,354 B2 | 9/2005 | Sakaguchi |
| 6,989,569 B1 | 1/2006 | Hiramoto et al. |
| 7,009,243 B2 | 3/2006 | Ishii et al. |
| 7,026,647 B2 | 4/2006 | Wu et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,177,187 B2 | 2/2007 | Ishii |
| 7,209,376 B2 | 4/2007 | Saito et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,336,519 B2 | 2/2008 | Ishii |
| 7,339,235 B1 | 3/2008 | Yamazaki et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,483,013 B2 | 1/2009 | Osame |
| 7,501,293 B2 | 3/2009 | Ito et al. |
| 7,570,516 B2 | 8/2009 | Ishii |
| 7,598,520 B2 | 10/2009 | Hirao et al. |
| 7,601,984 B2 | 10/2009 | Sano et al. |
| 7,663,174 B2 | 2/2010 | Shibata |
| 7,674,650 B2 | 3/2010 | Akimoto et al. |
| 7,679,951 B2 | 3/2010 | Wong et al. |
| 7,687,331 B2 | 3/2010 | Kim et al. |
| 7,732,819 B2 | 6/2010 | Akimoto et al. |
| 7,741,644 B2 | 6/2010 | Lyu et al. |
| 7,785,938 B2 | 8/2010 | Yamaguchi et al. |
| 7,791,074 B2 | 9/2010 | Iwasaki |
| 7,826,266 B2 | 11/2010 | Ishii |
| 7,859,889 B2 | 12/2010 | Kameshiro et al. |
| 7,910,490 B2 | 3/2011 | Akimoto et al. |
| 7,932,521 B2 | 4/2011 | Akimoto et al. |
| 7,935,582 B2 | 5/2011 | Iwasaki |
| 7,956,361 B2 | 6/2011 | Iwasaki |
| 7,982,250 B2 | 7/2011 | Yamazaki et al. |
| 7,993,964 B2 | 8/2011 | Hirao et al. |
| 7,994,500 B2 | 8/2011 | Kim et al. |
| 8,008,137 B2 | 8/2011 | Wu et al. |
| 8,040,722 B2 | 10/2011 | Wong et al. |
| 8,040,729 B2 | 10/2011 | Wong et al. |
| 8,058,645 B2 | 11/2011 | Jeong et al. |
| 8,084,331 B2 | 12/2011 | Ofuji et al. |
| 8,098,006 B2 | 1/2012 | Ishizaki et al. |
| 8,098,361 B2 | 1/2012 | Takahashi et al. |
| 8,120,159 B2 | 2/2012 | Yamaguchi et al. |
| 8,134,156 B2 | 3/2012 | Akimoto |
| 8,143,115 B2 | 3/2012 | Omura et al. |
| 8,148,721 B2 | 4/2012 | Hayashi et al. |
| 8,148,779 B2 | 4/2012 | Jeong et al. |
| 8,154,024 B2 | 4/2012 | Iwasaki |
| 8,158,464 B2 | 4/2012 | Akimoto |
| 8,179,707 B2 | 5/2012 | Song et al. |
| 8,188,480 B2 | 5/2012 | Itai |
| 8,198,127 B2 | 6/2012 | Wong et al. |
| 8,202,365 B2 | 6/2012 | Umeda et al. |
| 8,203,143 B2 | 6/2012 | Imai |
| 8,212,248 B2 | 7/2012 | Itagaki et al. |
| 8,217,435 B2 | 7/2012 | Chang et al. |
| 8,253,138 B2 | 8/2012 | Yamazaki et al. |
| 8,274,077 B2 | 9/2012 | Akimoto et al. |
| 8,288,856 B2 | 10/2012 | Yamaguchi et al. |
| 8,314,032 B2 | 11/2012 | Kawamura et al. |
| 8,339,828 B2 | 12/2012 | Yamazaki et al. |
| 8,351,012 B2 | 1/2013 | Takahashi et al. |
| 8,368,079 B2 | 2/2013 | Akimoto |
| 8,378,341 B2 | 2/2013 | Hayashi et al. |
| 8,378,403 B2 | 2/2013 | Kato |
| 8,389,417 B2 | 3/2013 | Yamazaki et al. |
| 8,400,817 B2 | 3/2013 | Yamazaki et al. |
| 8,450,783 B2 | 5/2013 | Yamazaki et al. |
| 8,455,868 B2 | 6/2013 | Yamazaki et al. |
| 8,466,463 B2 | 6/2013 | Akimoto et al. |
| 8,482,001 B2 | 7/2013 | Yamazaki et al. |
| 8,502,217 B2 | 8/2013 | Sato et al. |
| 8,525,165 B2 | 9/2013 | Akimoto |
| 8,559,220 B2 | 10/2013 | Yamazaki et al. |

(56) References Cited

U.S. PATENT DOCUMENTS

| | | |
|---|---|---|
| 8,569,812 B2 | 10/2013 | Chang et al. |
| 8,610,187 B2 | 12/2013 | Yamazaki et al. |
| 8,629,069 B2 | 1/2014 | Akimoto et al. |
| 8,669,550 B2 | 3/2014 | Akimoto et al. |
| 8,742,412 B2 | 6/2014 | Goyal et al. |
| 8,790,959 B2 | 7/2014 | Akimoto et al. |
| 8,796,069 B2 | 8/2014 | Akimoto et al. |
| 9,099,562 B2 | 8/2015 | Akimoto et al. |
| 2001/0015450 A1 | 8/2001 | Sugibayashi et al. |
| 2001/0046027 A1 | 11/2001 | Tai et al. |
| 2002/0056838 A1 | 5/2002 | Ogawa |
| 2002/0096702 A1 | 7/2002 | Ishii et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0245555 A1 | 12/2004 | Ueda |
| 2005/0017302 A1 | 1/2005 | Hoffman |
| 2005/0135181 A1 | 6/2005 | Shionoiri et al. |
| 2005/0199959 A1 | 9/2005 | Chiang et al. |
| 2005/0199960 A1 | 9/2005 | Hoffman et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0079034 A1 | 4/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0216877 A1 | 9/2006 | Toyota et al. |
| 2006/0227648 A1 | 10/2006 | Kameshiro et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0262483 A1 | 11/2006 | Osame |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063287 A1 | 3/2007 | Sano et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0181953 A1 | 8/2007 | Lyu et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215906 A1 | 9/2007 | Wu et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0093595 A1 | 4/2008 | Song et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0149984 A1 | 6/2008 | Chang et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0224229 A1* | 9/2008 | Tajima .............. H01L 27/11206 257/379 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296567 A1 | 12/2008 | Irving et al. |
| 2008/0296568 A1 | 12/2008 | Ryu et al. |
| 2008/0308805 A1 | 12/2008 | Akimoto et al. |
| 2009/0002590 A1 | 1/2009 | Kimura |
| 2009/0045397 A1* | 2/2009 | Iwasaki .............. H01L 29/66969 257/43 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1 | 5/2009 | Wang et al. |
| 2009/0121233 A1 | 5/2009 | Yasukawa |
| 2009/0134399 A1 | 5/2009 | Sakakura et al. |
| 2009/0142888 A1 | 6/2009 | Tsuchiya |
| 2009/0152506 A1 | 6/2009 | Umeda et al. |
| 2009/0152541 A1 | 6/2009 | Maekawa et al. |
| 2009/0186445 A1 | 7/2009 | Akimoto |
| 2009/0189153 A1 | 7/2009 | Iwasaki et al. |
| 2009/0189155 A1 | 7/2009 | Akimoto |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0003783 A1 | 1/2010 | Akimoto |
| 2010/0032668 A1 | 2/2010 | Yamazaki et al. |
| 2010/0065844 A1 | 3/2010 | Tokunaga |
| 2010/0092800 A1 | 4/2010 | Itagaki et al. |
| 2010/0096628 A1 | 4/2010 | Song et al. |
| 2010/0097838 A1 | 4/2010 | Tanaka et al. |
| 2010/0102397 A1 | 4/2010 | Park et al. |
| 2010/0109002 A1 | 5/2010 | Itagaki et al. |
| 2010/0136743 A1 | 6/2010 | Akimoto et al. |
| 2010/0140608 A1 | 6/2010 | Park et al. |
| 2010/0148171 A1 | 6/2010 | Hayashi et al. |
| 2010/0193785 A1 | 8/2010 | Kimura |
| 2010/0203673 A1 | 8/2010 | Hayashi et al. |
| 2010/0219411 A1 | 9/2010 | Hoffman et al. |
| 2010/0276689 A1 | 11/2010 | Iwasaki |
| 2010/0279462 A1 | 11/2010 | Iwasaki |
| 2010/0295042 A1 | 11/2010 | Yano et al. |
| 2010/0320458 A1 | 12/2010 | Umeda et al. |
| 2010/0320459 A1 | 12/2010 | Umeda et al. |
| 2011/0089414 A1 | 4/2011 | Yamazaki et al. |
| 2011/0089417 A1 | 4/2011 | Yamazaki et al. |
| 2011/0089419 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0104851 A1 | 5/2011 | Akimoto et al. |
| 2011/0110145 A1 | 5/2011 | Yamazaki et al. |
| 2011/0117697 A1 | 5/2011 | Akimoto et al. |
| 2011/0121290 A1 | 5/2011 | Akimoto et al. |
| 2011/0122673 A1 | 5/2011 | Kamata et al. |
| 2011/0134683 A1 | 6/2011 | Yamazaki et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2012/0168750 A1 | 7/2012 | Hayashi et al. |
| 2012/0208318 A1 | 8/2012 | Hoffman et al. |
| 2013/0056728 A1 | 3/2013 | Morosawa et al. |
| 2013/0134418 A1 | 5/2013 | Hayashi et al. |
| 2013/0256657 A1 | 10/2013 | Yamazaki et al. |
| 2013/0292677 A1 | 11/2013 | Yamazaki et al. |

(56) References Cited

U.S. PATENT DOCUMENTS

| | | | |
|---|---|---|---|
| 2014/0015021 | A1 | 1/2014 | Chang et al. |
| 2015/0084048 | A1 | 3/2015 | Hayashi et al. |

FOREIGN PATENT DOCUMENTS

| | | | |
|---|---|---|---|
| EP | 1603163 | A | 12/2005 |
| EP | 1737044 | A | 12/2006 |
| EP | 1770788 | A | 4/2007 |
| EP | 1835535 | A | 9/2007 |
| EP | 2073211 | A | 6/2009 |
| EP | 2226847 | A | 9/2010 |
| JP | 57-105889 | A | 7/1982 |
| JP | 60-198861 | A | 10/1985 |
| JP | 62-254462 | A | 11/1987 |
| JP | 62-274773 | A | 11/1987 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 07-211799 | A | 8/1995 |
| JP | 08-264794 | A | 10/1996 |
| JP | 11-040772 | A | 2/1999 |
| JP | 11-505377 | | 5/1999 |
| JP | 11-251518 | A | 9/1999 |
| JP | 2000-044236 | A | 2/2000 |
| JP | 2000-114453 | A | 4/2000 |
| JP | 2000-150900 | A | 5/2000 |
| JP | 2001-053164 | A | 2/2001 |
| JP | 2001-053166 | A | 2/2001 |
| JP | 2001-274355 | A | 10/2001 |
| JP | 2001-339057 | A | 12/2001 |
| JP | 2002-026283 | A | 1/2002 |
| JP | 2002-076356 | A | 3/2002 |
| JP | 2002-093171 | A | 3/2002 |
| JP | 2002-094029 | A | 3/2002 |
| JP | 2002-203913 | A | 7/2002 |
| JP | 2002-289859 | A | 10/2002 |
| JP | 2002-368226 | A | 12/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-012358 | A | 1/2006 |
| JP | 2006-294116 | A | 10/2006 |
| JP | 2007-123861 | A | 5/2007 |
| JP | 2007-250862 | A | 9/2007 |
| JP | 2007-294897 | A | 11/2007 |
| JP | 2007-318106 | A | 12/2007 |
| JP | 2008-140684 | A | 6/2008 |
| JP | 2009-135350 | A | 6/2009 |
| JP | 2009-152596 | A | 7/2009 |
| JP | 2010-021170 | A | 1/2010 |
| JP | 2010-062547 | A | 3/2010 |
| JP | 2010-141230 | A | 6/2010 |
| KR | 2010-0019357 | A | 2/2010 |
| TW | 200937613 | | 9/2009 |
| WO | WO-2004/114391 | | 12/2004 |

OTHER PUBLICATIONS

Asaoka.Y et al., "29.1:Polarizer-Free Reflective LCD Combined With Ultra Low-Power Driving Technology", SID Digest '09 : SID Internatioal Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, 578-581.

(56) References Cited

OTHER PUBLICATIONS

Kikuchi.H et al., "62.2:Invited Paper:Fast Electro-Optical Switching in Polymer-Stabilized Liquid Crystalline Blue Phases for Display Applicaiton", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO

(56) References Cited

OTHER PUBLICATIONS (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator" Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Jung.S et al., "Highly Cost Effective and High Performance 65NM S3(Stacked Single-Crystal SI)(SRAM Technology With 25F2,0.16UM2 Cell and Doubly Stacked SSTFT Cell Transistors for Ultra High Density and High Speed Applications", 2005 Symposium on VLSI Technology : Digest of Technical Papers, Jun. 14, 2005, pp. 220-221.

International Search Report (Application No. PCT/JP2011/063996) dated Sep. 13, 2011.

Written Opinion (Application No. PCT/JP2011/063996) dated Sep. 13, 2011.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Taiwanese Office Action (Application No. 100122626) dated Oct. 26, 2015.

Taiwanese Office Action (Application No. 103137223) dated Dec. 7, 2015.

Dodge.J, "Power MOSFET tutorial, Part 1", EDN Netrowrk, Dec. 5, 2006, p. 10pages.

Taiwanese Office Action (Application No. 105142262) dated Mar. 8, 2017.

\* cited by examiner

SEMICONDUCTOR DEVICE

CROSS-REFERENCE TO RELATED APPLICATIONS

This application is a divisional of U.S. application Ser. No. 15/722,016, filed Oct. 2, 2017, now allowed, which is a continuation of U.S. application Ser. No. 14/162,837, filed Jan. 24, 2014, now U.S. Pat. No. 9,780,093, which is a continuation of U.S. application Ser. No. 13/767,904, filed Feb. 15, 2013, now U.S. Pat. No. 8,637,865, which is a continuation of U.S. application Ser. No. 13/169,544, filed Jun. 27, 2011, now U.S. Pat. No. 8,378,403, which claims the benefit of a foreign priority application filed in Japan as Serial No. 2010-152021 on Jul. 2, 2010, all of which are incorporated by reference.

TECHNICAL FIELD

The present invention relates to a semiconductor device using a semiconductor element and a method for manufacturing the semiconductor device.

BACKGROUND ART

Memory devices using semiconductor elements are broadly classified into two categories: a volatile device that loses stored data when power supply stops, and a nonvolatile device that holds stored data even when power is not supplied.

A typical example of a volatile memory device is a dynamic random access memory (DRAM). A DRAM stores data in such a manner that a transistor included in a memory element is selected and charge is stored in a capacitor.

When data is read from a DRAM, charge in a capacitor is lost according to the above principle; thus, another write operation is necessary every time data is read. Moreover, a transistor included in a memory element has leakage current (off-state current) between a source and a drain in an off state, or the like and charge flows into or out of a capacitor even if the transistor is not selected, which makes a data holding period short. For that reason, another write operation (refresh operation) is necessary at predetermined intervals, and it is difficult to sufficiently reduce power consumption. Further, since stored data is lost when power supply stops, another memory device using a magnetic material or an optical material is needed to hold stored data for a long time.

Another example of a volatile memory device is a static random access memory (SRAM). An SRAM holds stored data by using a circuit such as a flip-flop and thus does not need refresh operation, which is an advantage over a DRAM. However, cost per storage capacity is high because a circuit such as a flip-flop is used. Moreover, as in a DRAM, stored data in an SRAM is lost when power supply stops.

A typical example of a nonvolatile memory device is a flash memory. A flash memory includes a floating gate between a gate electrode and a channel formation region of a transistor and stores data by holding charge in the floating gate. Therefore, a flash memory has advantages in that the data holding period is extremely long (almost permanent) and refresh operation which is necessary in a volatile memory device is not needed (e.g., see Patent Document 1).

However, a gate insulating layer included in a memory element deteriorates owing to tunneling current generated in writing, so that the memory element stops its function after a certain number of write operations. In order to reduce adverse effects of this problem, a method in which the number of write operations for memory elements is equalized is employed, for example. However, a complicated peripheral circuit is needed to realize this method. Moreover, even when such a method is employed, the fundamental problem of lifetime is not solved. In other words, a flash memory is not suitable for applications in which data is frequently rewritten.

In addition, a flash memory needs high voltage for holding charge in the floating gate or removing charge from the floating gate, and also needs a circuit for generating high voltage. Further, it takes a relatively long time to hold or remove charge, and it is not easy to perform writing and erasing at higher speed.

REFERENCE

[Patent Document]
[Patent Document 1] Japanese Published Patent Application No. S57-105889

DISCLOSURE OF INVENTION

In view of the above problems, an object of one embodiment of the present invention is to provide a semiconductor device with a novel structure in which stored data can be held even when power is not supplied and there is no limit on the number of write operations. Another object is to increase the integration degree of the semiconductor device with a novel structure.

In one embodiment of the present invention, a semiconductor device is manufactured using an oxide semiconductor. In particular, a highly purified oxide semiconductor is used. A transistor including an oxide semiconductor has extremely low leakage current; therefore, data can be held for a long time. In the case of using a highly purified oxide semiconductor, leakage current is much lower and thus data can be held for an extremely long time.

Specifically, the following structure can be employed, for example.

One embodiment of the present invention is a semiconductor device including a memory cell array including a first memory cell and a second memory cell, and a driver circuit driving the first memory cell and the second memory cell. The first memory cell includes a first transistor one of whose source and drain is connected to a first bit line and the other of whose source and drain is connected to a first source line, and a second transistor connected to a gate of the first transistor. The second memory cell includes a third transistor one of whose source and drain is connected to a second bit line and the other of whose source and drain is connected to a second source line, and a fourth transistor connected to a gate of the third transistor. A semiconductor material included in a channel formation region of the first transistor is different from a semiconductor material included in channel formation regions of the second to fourth transistors. The first memory cell and the second memory cell are stacked so as to overlap at least partly with each other.

In the above structure, the semiconductor material included in the channel formation region of the first transistor preferably includes a semiconductor material other than an oxide semiconductor. In the above structure, the semiconductor material included in the channel formation regions of the second to fourth transistors preferably includes an oxide semiconductor material.

In the above structure, a part of the driver circuit preferably includes the semiconductor material included in the channel formation region of the first transistor. In the above structure, a part of the driver circuit preferably includes the semiconductor material included in the channel formation regions of the second to fourth transistors.

In the above structure, it is preferable that a part of the driver circuit include the semiconductor material included in the channel formation region of the first transistor, and that another part of the driver circuit include the semiconductor material included in the channel formation regions of the second to fourth transistors.

In the above structure, it is preferable that the first source line be electrically connected to the second source line. In the above structure, it is preferable that the driver circuit include a selector circuit selecting the first memory cell or the second memory cell. In the above structure, it is preferable that the first bit line and the second bit line be electrically connected to the selector circuit.

Note that although the transistor is formed using an oxide semiconductor material in the above structure, one embodiment of the present invention is not limited to this. A material which can realize off-state current characteristics comparable to those of the oxide semiconductor material, such as a wide-gap material like silicon carbide (specifically, a semiconductor material with an energy gap Eg of greater than 3 eV, for example), or the like may be used.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode. Moreover, the terms such as "over" and "below" are simply used for convenience of explanation.

In addition, in this specification and the like, the term such as "electrode" or "wiring" does not limit a function of a component. For example, an "electrode" is sometimes used as part of a "wiring", and vice versa. Furthermore, the term such as "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flow is changed in circuit operation, for example. Therefore, the terms "source" and "drain" can be used to denote the drain and the source, respectively, in this specification and the like.

Note that in this specification and the like, the term "electrically connected" includes the case where components are connected through an "object having any electric function". There is no particular limitation on an "object having any electric function" as long as electric signals can be transmitted and received between components that are connected through the object.

Examples of the "object having any electric function" are a switching element such as a transistor, a resistor, an inductor, a capacitor, and an element having a variety of functions as well as an electrode and a wiring.

Since the off-state current of a transistor including an oxide semiconductor is extremely low, stored data can be held for a long time by using the transistor. In other words, power consumption can be sufficiently reduced because refresh operation becomes unnecessary or the frequency of refresh operation can be extremely low. Moreover, stored data can be held for a long time even when power is not supplied.

Further, a semiconductor device according to one embodiment of the present invention does not need high voltage for data writing, and there is no problem of deterioration of an element. For example, since there is no need to perform injection of electrons into a floating gate and extraction of electrons from the floating gate which are needed in a conventional nonvolatile memory, deterioration of a gate insulating layer does not occur. That is, the semiconductor device according to one embodiment of the present invention does not have a limit on the number of times of rewriting, which has been a problem of a conventional nonvolatile memory, and thus has significantly improved reliability. Furthermore, data is written by turning on or off the transistor, whereby high-speed operation can be easily realized. In addition, there is an advantage in that operation for erasing data is not needed.

Since a transistor including a material other than an oxide semiconductor can operate at sufficiently high speed, a semiconductor device in which the transistor is used in combination with a transistor including an oxide semiconductor can perform operation (e.g., data reading) at sufficiently high speed. Further, with the transistor including a material other than an oxide semiconductor, a variety of circuits (such as a logic circuit or a driver circuit) which is required to operate at high speed can be favorably realized.

Thus, a semiconductor device having a novel feature can be realized by being provided with both the transistor including a material other than an oxide semiconductor (a transistor capable of operation at sufficiently high speed, in general) and the transistor including an oxide semiconductor (a transistor whose off-state current is sufficiently low, in general).

Moreover, in one embodiment of the present invention, a memory cell or a driver circuit partly has a stacked structure, whereby a semiconductor device whose integration degree is improved can be provided.

BRIEF DESCRIPTION OF DRAWINGS

In the accompanying drawings:

FIGS. 2A-1, 2A-2, 2B, and 2C are circuit diagrams of a semiconductor device;

BEST MODE FOR CARRYING OUT THE INVENTION

Figure 1:
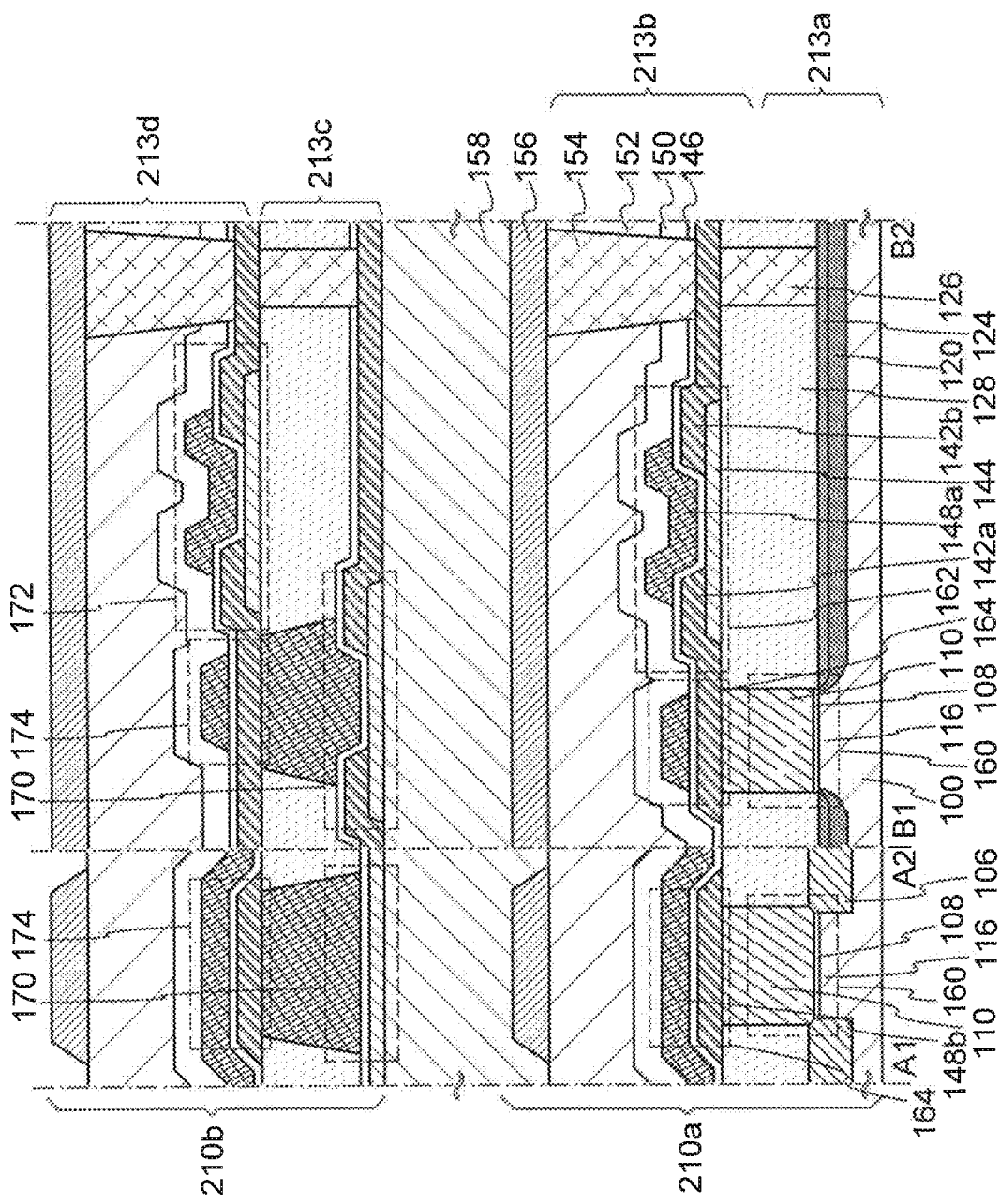
FIG. 1 is a cross-sectional view of a semiconductor device.

Hereinafter, embodiments of the present invention will be described with reference to the drawings. Note that the present invention is not limited to the following description and it is easily understood by those skilled in the art that modes and details can be modified in various ways without departing from the spirit and scope of the present invention. Therefore, the present invention is not construed as being limited to the description of the following embodiments.

Note that the position, size, range, or the like of each structure illustrated in drawings and the like is not accurately represented in some cases for easy understanding. Therefore, one embodiment of the present invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a structure and a manufacturing method of a semiconductor device according to one embodiment of the present invention will be described with reference to FIG. 1, FIGS. 2A-1, 2A-2, 2B, and 2C, FIG. 3, FIG. 4, FIG. 5, FIG. 6, FIG. 7, FIG. 8, FIG. 9, FIG. 10, FIG. 11, FIG. 12, FIG. 13, FIG. 14, FIG. 15, FIGS. 16A to 16D, FIGS. 17A to 17D, FIGS. 18A to 18D, and FIGS. 19A and 19B.

<Cross-sectional Structure of Semiconductor Device>

FIG. 1 illustrates a cross section of a semiconductor device. In FIG. 1, A1-A2 is a cross section perpendicular to a channel length direction of a transistor, and B1-B2 is a cross section parallel to the channel length direction of the transistor. The semiconductor device illustrated in FIG. 1 includes a first stack 210a and a second stack 210b. In the first stack 210a, a transistor 160 including a first semiconductor material is provided in a lower portion, and a transistor 162 including a second semiconductor material is provided in an upper portion. In the second stack 210b, a transistor 170 including the second semiconductor material is provided in a lower portion, and a transistor 172 including the second semiconductor material is provided in an upper portion. In the first stack 210a, a stack 213a corresponds to a layer which includes the transistor 160 including the first semiconductor material, and a stack 213b corresponds to a layer which includes the transistor 162 including the second semiconductor material. In the second stack 210b, a stack 213c corresponds to a layer which includes the transistor 170 including the second semiconductor material, and a stack 213d corresponds to a layer which includes the transistor 172 including the second semiconductor material.

FIG. 1 illustrates a structure in which the first stack 210a includes one transistor 160, one transistor 162, and one capacitor 164; however, the first stack 210a may include a plurality of transistors 160, a plurality of transistors 162, and a plurality of capacitors 164. Similarly, the second stack 210b includes one transistor 170, one transistor 172, and one capacitor 174; however, the second stack 210b may include a plurality of transistors 170, a plurality of transistors 172, and a plurality of capacitors 174.

Here, the first semiconductor material is preferably different from the second semiconductor material. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, or gallium arsenide, and a single crystal semiconductor is preferably used. A transistor including such a semiconductor material can operate at high speed easily. Alternatively, an organic semiconductor material or the like may be used. On the other hand, a transistor including an oxide semiconductor can hold charge for a long time owing to its characteristics.

Either an n-channel transistor or a p-channel transistor can be employed as the transistor 160, the transistor 162, the transistor 170, and the transistor 172. Here, the case where the transistor 160, the transistor 162, the transistor 170, and the transistor 172 are all re-channel transistors is described. The technical feature of one embodiment of the present invention is to use a semiconductor material with which off-state current can be sufficiently reduced, such as an oxide semiconductor, in the transistor 162 and the transistor 172 in order to hold data. Therefore, it is not necessary to limit specific conditions such as a material, a structure, and the like of the semiconductor device to those given here.

The transistor 160 includes a channel formation region 116 provided in a substrate 100 including a semiconductor material (e.g., silicon), impurity regions 120 provided such that the channel formation region 116 is sandwiched therebetween, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may be referred to as a transistor for the sake of convenience. Further, in such a case, in description of connection of a transistor, a source region and a source electrode may be collectively referred to as a source electrode, and a drain region and a drain electrode may be collectively referred to as a drain electrode. That is, in this specification and the like, the term "source electrode" may include a source region.

An electrode 126 is connected to part of the metal compound region 124 of the transistor 160. Here, the electrode 126 functions as a source electrode or a drain electrode of the transistor 160. Further, the substrate 100 is provided with an element isolation insulating layer 106 which surrounds the transistor 160. An insulating layer 128 is provided in contact with the transistor 160. Note that in order to realize high integration, it is preferable that the transistor 160 do not have a sidewall insulating layer as illustrated in FIG. 1. On the other hand, in the case where characteristics of the transistor 160 are emphasized, a sidewall insulating layer may be provided on a side surface of the gate electrode 110 and the impurity regions 120 may include an impurity region having a different impurity concentration in a region overlapping with the sidewall insulating layer.

The transistor 162 includes an oxide semiconductor layer 144 provided over the insulating layer 128 and the like; a source or drain electrode 142a and a source or drain electrode 142b which are electrically connected to the oxide semiconductor layer 144; a gate insulating layer 146 covering the oxide semiconductor layer 144, the source or drain electrode 142a, and the source or drain electrode 142b; and a gate electrode 148a provided over the gate insulating layer 146 so as to overlap with the oxide semiconductor layer 144. Note that the transistor 170 and the transistor 172 in the second stack 210b can each have a structure similar to that of the transistor 162.

Here, an oxide semiconductor layer used for a transistor, such as the oxide semiconductor layer 144, is preferably an oxide semiconductor layer which is highly purified by sufficiently removing an impurity such as hydrogen and by sufficiently supplying oxygen. Specifically, the hydrogen concentration of the oxide semiconductor layer is lower than or equal to $5\times10^{19}$ atoms/cm$^3$, preferably lower than or equal to $5\times10^{18}$ atoms/cm$^3$, further preferably lower than or equal to $5\times10^{17}$ atoms/cm$^3$, for example. Note that the above hydrogen concentration of the oxide semiconductor layer is measured by secondary ion mass spectrometry (SIMS). In the oxide semiconductor layer in which the hydrogen concentration is sufficiently reduced and defect levels in the energy gap due to oxygen deficiency are reduced by sufficiently supplying oxygen, the carrier concentration is lower than $1\times10^{12}$/cm$^3$, preferably lower than $1\times10^{11}$/cm', further preferably lower than $1.45\times10^{10}$/cm$^3$. For example, the off-state current (here, current per micrometer (μm) of channel width) at room temperature (25° C.) is lower than or equal to 100 zA (1 zA (zeptoampere) is $1\times10^{-21}$ A), preferably lower than or equal to 10 zA. Thus, by using an i-type (intrinsic) or substantially i-type oxide semiconductor, a transistor (such as the transistor 162, the transistor 170, or the transistor 172) which has extremely excellent off-state current characteristics can be obtained.

Note that although the transistor 162, the transistor 170, the transistor 172, and the like each include an oxide semiconductor layer processed into an island shape in order to suppress leakage current between elements which is caused owing to miniaturization, an oxide semiconductor layer which is not processed into an island shape may be employed. When an oxide semiconductor layer is not processed into an island shape, contamination of the oxide semiconductor layer due to etching in the processing can be prevented.

The capacitor 164 includes the source or drain electrode 142a, the gate insulating layer 146, and a conductive layer 148b. That is, the source or drain electrode 142a functions as one electrode of the capacitor 164, and the conductive layer 148b functions as the other electrode of the capacitor 164. With such a structure, sufficient capacitance can be secured. Further, insulation between the source or drain electrode 142a and the conductive layer 148b can be sufficiently secured by stacking the oxide semiconductor layer 144 and the gate insulating layer 146. In the case where a capacitor is not needed, the capacitor 164 may be omitted. The structure of the capacitor 174 is similar to that of the capacitor 164.

Note that in the transistor 162 and the capacitor 164, end portions of the source or drain electrode 142a and the source or drain electrode 142b are preferably tapered. When the end portions of the source or drain electrode 142a and the source or drain electrode 142b are tapered, coverage with the gate insulating layer 146 can be improved and disconnection can be prevented. Here, a taper angle is, for example, greater than or equal to 30° and less than or equal to 60°. Note that the taper angle refers to an inclination angle formed by a side surface and a bottom surface of a layer having a tapered shape (e.g., the source or drain electrode 142a) when seen from the direction perpendicular to a cross section (a plane perpendicular to a surface of a substrate) of the layer. The same applies to the transistor 170, the transistor 172, and the capacitor 174.

An insulating layer 150 and an insulating layer 152 are provided over the transistor 162 and the capacitor 164. An electrode 154 is provided in an opening formed in the gate insulating layer 146, the insulating layer 150, the insulating layer 152, and the like, and a wiring 156 is formed over the insulating layer 152 to be connected to the electrode 154. Note that although the metal compound region 124, the source or drain electrode 142b, and the wiring 156 are connected to one another through the electrode 126 and the electrode 154 in FIG. 1, one embodiment of the present invention is not limited to this. For example, the source or drain electrode 142b may be directly connected to the metal compound region 124. Alternatively, the wiring 156 may be directly connected to the source or drain electrode 142b.

Note that in FIG. 1, the electrode 126 connecting the metal compound region 124 to the source or drain electrode 142b and the electrode 154 connecting the source or drain electrode 142b to the wiring 156 overlap with each other. In other words, a region in which the electrode 126 functioning as a source electrode or a drain electrode of the transistor 160 is in contact with the source or drain electrode 142b of the transistor 162 overlaps with a region in which the source or drain electrode 142b of the transistor 162 is in contact with the electrode 154. With such a planar layout, an increase in the element area due to contact regions of the electrodes or wirings can be suppressed. In other words, the integration degree of the semiconductor device can be increased.

In this embodiment, the transistor 160 in the first stack 210a is provided so as to overlap at least partly with the transistor 162 and the capacitor 164. For example, the conductive layer 148b of the capacitor 164 is provided to overlap at least partly with the source or drain electrode 142a of the transistor 162 and the gate electrode 110 of the transistor 160. With such a planar layout, the integration degree of a memory cell can be increased. For example, given that the minimum feature size is F, the area occupied by a memory cell can be 15 F$^2$ to 25 F$^2$.

Similarly, in the second stack 210b, the transistor 170 is provided so as to overlap at least partly with the transistor 172 and the capacitor 174. For example, an electrode (corresponding to the conductive layer 148b of the capacitor 164) of the capacitor 174 is provided to overlap at least partly with a source or drain electrode (corresponding to the source or drain electrode 142a of the transistor 162) of the transistor 172 and a gate electrode (corresponding to the gate electrode 110 of the transistor 160) of the transistor 170. Thus, the integrated first stack 210a and the integrated second stack 210b are stacked with an insulating layer 158 positioned therebetween, whereby higher integration of the semiconductor device can be achieved.

Note that FIG. 1 illustrates the example in which two layers, the first stack 210a and the second stack 210b are stacked; however, one embodiment of the present invention is not limited to this, and a stacked structure including three or more layers can be employed. In that case, a third stack can have a structure similar to that of the second stack 210b. With such a stacked structure, still higher integration of the semiconductor device can be achieved.

<Circuit Configuration of Semiconductor Device>

Next, a circuit configuration and operation of the semiconductor device illustrated in FIG. 1 will be described with reference to FIGS. 2A-1, 2A-2, 2B, and 2C. Note that in some circuit diagrams, "OS" is written beside a transistor in order to indicate that the transistor includes an oxide semiconductor.

<Basic Configuration>

Figures 1, 2A:
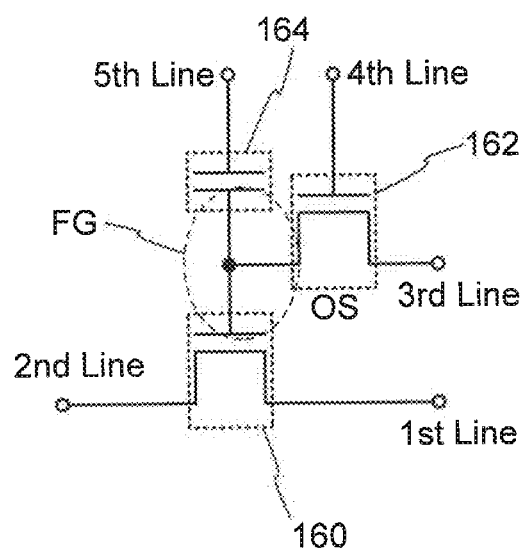

In a semiconductor device illustrated in FIG. 2A-1, a first wiring (a 1st Line) is electrically connected to a source electrode (or a drain electrode) of the transistor 160. A second wiring (a 2nd Line) is electrically connected to the drain electrode (or the source electrode) of the transistor 160. In addition, a third wiring (a 3rd Line) is electrically connected to a source electrode (or a drain electrode) of the transistor 162, and a fourth wiring (a 4th Line) is electrically connected to a gate electrode of the transistor 162. Further, a gate electrode of the transistor 160 and the drain electrode (or the source electrode) of the transistor 162 are electrically connected to one electrode of the capacitor 164, and a fifth wiring (a 5th Line) is electrically connected to the other electrode of the capacitor 164. Note that the circuit configuration illustrated in FIG. 2A-1 corresponds to a configuration of a circuit included in the first stack 210a illustrated in FIG. 1, and the circuit illustrated in FIG. 2A-1 functions as a memory cell.

Here, the above transistor including an oxide semiconductor is used as the transistor 162, for example. A transistor including an oxide semiconductor has a characteristic of extremely low off-state current. For that reason, a potential of the gate electrode of the transistor 160 can be held for an extremely long time by turning off the transistor 162. Provision of the capacitor 164 facilitates holding of charge supplied to the gate electrode of the transistor 160 and reading of stored data.

Although there is no particular limitation on the transistor 160, a transistor including a semiconductor material other than an oxide semiconductor is used as the transistor 160, for example. In terms of increasing the speed of data reading, it is preferable to use, for example, a transistor with high switching speed such as a transistor including single crystal silicon.

Figure 2B:
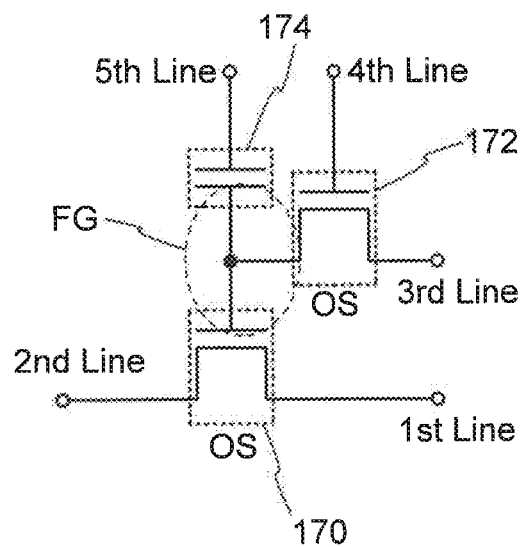

In a semiconductor device illustrated in FIG. 2B, a first wiring (a 1st Line) is electrically connected to a source electrode (or a drain electrode) of the transistor 170. A second wiring (a 2nd Line) is electrically connected to the drain electrode (or the source electrode) of the transistor 170. In addition, a third wiring (a 3rd Line) is electrically connected to a source electrode (or a drain electrode) of the transistor 172, and a fourth wiring (a 4th Line) is electrically connected to a gate electrode of the transistor 172. Further, a gate electrode of the transistor 170 and the drain electrode (or the source electrode) of the transistor 172 are electrically connected to one electrode of the capacitor 174, and a fifth wiring (a 5th Line) is electrically connected to the other electrode of the capacitor 174. Note that the circuit configuration illustrated in FIG. 2B corresponds to a configuration of a circuit included in the second stack 210b illustrated in FIG. 1.

Here, the above transistor including an oxide semiconductor is used as the transistor 170 and the transistor 172. The transistor including an oxide semiconductor has a characteristic of extremely low off-state current. For that reason, a potential of the gate electrode of the transistor 170 can be held for an extremely long time by turning off the transistor 172. Provision of the capacitor 174 facilitates holding of charge supplied to the gate electrode of the transistor 170 and reading of stored data. Note that the transistors 170 and 172 including an oxide semiconductor each have a channel length (L) of greater than or equal to 10 nm and less than or equal to 1000 nm; therefore, power consumption is low and operation speed is sufficiently high.

Figures 2, 2A:
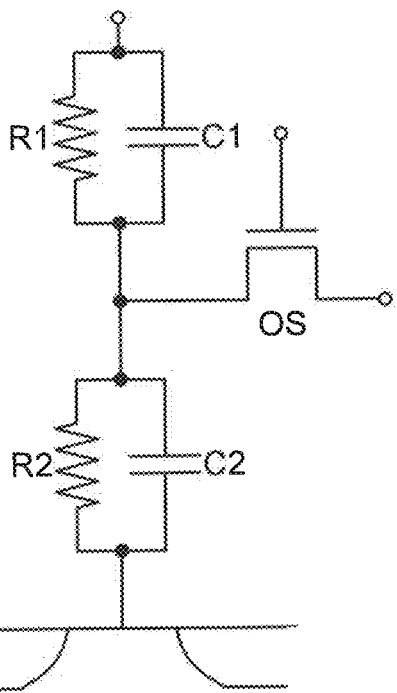
Figure 2C:
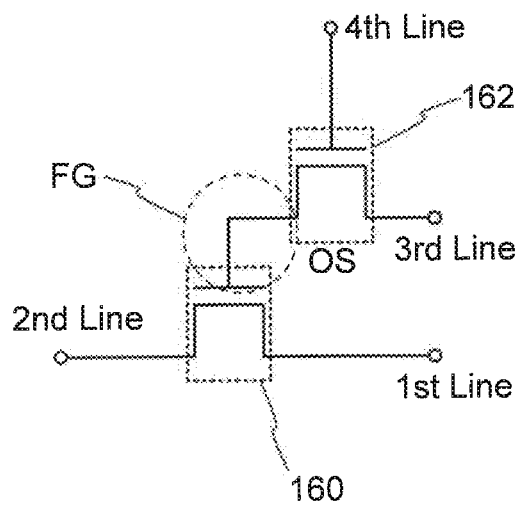

As illustrated in FIG. 2C, the capacitor 164 can be omitted in FIG. 2A-1. In a similar manner, the capacitor 174 can be omitted in FIG. 2B.

The semiconductor device illustrated in FIG. 2A-1 utilizes a characteristic in which the potential of the gate electrode of the transistor 160 can be held, whereby writing, holding, and reading of data can be performed as follows. In the semiconductor device illustrated in FIG. 2B, writing, holding, and reading of data can be performed in a manner similar to that in the semiconductor device illustrated in FIG. 2A-1; therefore, detailed description is omitted.

Firstly, writing and holding of data will be described with reference to FIG. 2A-1. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, predetermined charge is supplied to the gate electrode of the transistor 160 (writing). Here, one of charges for supply of two different potentials (hereinafter, a charge for supply of a low potential is referred to as a charge $Q_L$ and a charge for supply of a high potential is referred to as a charge $Q_H$) is supplied. Note that charges for supply of three or more different potentials may be employed to improve storage capacity. After that, the potential of the fourth wiring is set to a potential at which the transistor 162 is turned off, so that the transistor 162 is turned off. Thus, the charge supplied to the gate electrode of the transistor 160 is held (holding).

Since the off-state current of the transistor 162 is extremely low, the charge of the gate electrode of the transistor 160 is held for a long time.

Secondly, reading of data will be described. By supplying an appropriate potential (a reading potential) to the fifth wiring while a predetermined potential (a constant potential) is supplied to the first wiring, the potential of the second wiring varies depending on the amount of charge held in the gate electrode of the transistor 160. This is because in general, when the transistor 160 is an n-channel transistor, an apparent threshold voltage $V_{th\_H}$ in the case where $Q_H$ is supplied to the gate electrode of the transistor 160 is lower than an apparent threshold voltage $V_{th\_L}$ in the case where $Q_L$ is supplied to the gate electrode of the transistor 160. Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby charge supplied to the gate electrode of the transistor 160 can be determined. For example, in the case where $Q_H$ is supplied in writing, when the potential of the fifth wiring is $V_0$ ($>V_{th\_H}$), the transistor 160 is turned on. In the case where $Q_L$ is supplied in writing, even when the potential of the fifth wiring is $V_0$ ($<V_{th\_L}$), the transistor 160 remains in an off state. Therefore, the stored data can be read by measuring the potential of the second wiring.

Note that in the case where memory cells are arrayed to be used, only data of desired memory cells is needed to be read. Thus, in the case where data of predetermined memory cells is read and data of the other memory cells is not read, a potential which allows the transistor 160 to be turned off regardless of a state of the gate electrode, that is, a potential lower than $V_{th\_H}$ may be supplied to fifth wirings of the memory cells whose data is not to be read. Alternatively, a potential which allows the transistor 160 to be turned on regardless of a state of the gate electrode, that is, a potential higher than $V_{th\_L}$ may be supplied to the fifth wirings.

Thirdly, rewriting of data will be described. Rewriting of data is performed in a manner similar to that of the writing and holding of data. That is, the potential of the fourth wiring is set to a potential at which the transistor 162 is turned on, so that the transistor 162 is turned on. Accordingly, the potential of the third wiring (a potential relating to new data) is supplied to the gate electrode of the transistor 160 and the capacitor 164. After that, the potential of the fourth wiring is set to a potential at which the transistor 162 is turned off, so that the transistor 162 is turned off. Thus, charge for new data is supplied to the gate electrode of the transistor 160.

In the semiconductor device according to one embodiment of the present invention, data can be directly rewritten by another write operation of data as described above. Therefore, extraction of charge from a floating gate with the use of high voltage, which is necessary in a flash memory or the like, is not needed and a decrease in operation speed due to erasing operation can be suppressed. In other words, high-speed operation of the semiconductor device can be realized.

Note that the drain electrode (or the source electrode) of the transistor 162 is electrically connected to the gate electrode of the transistor 160, thereby having a function similar to that of a floating gate of a floating-gate transistor which is used as a nonvolatile memory element. Therefore, a portion in the drawing where the drain electrode (or the source electrode) of the transistor 162 is electrically connected to the gate electrode of the transistor 160 is called a floating gate portion FG in some cases. When the transistor 162 is off, the floating gate portion FG can be regarded as being embedded in an insulator and charge is held in the floating gate portion FG. The off-state current of the transistor 162 including an oxide semiconductor is lower than or equal to one hundred thousandth of the off-state current of a transistor including a silicon semiconductor or the like; thus, loss of the charge accumulated in the floating gate portion FG due to leakage current of the transistor 162 is negligible. That is, with the transistor 162 including an oxide semiconductor, a nonvolatile memory device which can hold data without being supplied with power can be realized.

For example, when the off-state current of the transistor 162 is 10 zA (1 zA (zeptoampere) is $1 \times 10^{-21}$ A) or less at room temperature (25° C.) and the capacitance of the capacitor 164 is approximately 10 fF, data can be held for $10^4$ seconds or more. Needless to say, the holding time depends on transistor characteristics and the capacitance.

Further, in that case, the problem of deterioration of a gate insulating layer (a tunnel insulating layer), which is pointed out in a conventional floating-gate transistor, does not arise. That is, the problem of deterioration of a gate insulating layer due to injection of electrons into a floating gate, which has been regarded as a problem, can be solved. This means that there is no limit on the number of write operations in principle. Furthermore, high voltage needed for writing or erasing in a conventional floating-gate transistor is not necessary.

Components such as transistors in the semiconductor device illustrated in FIG. 2A-1 can be regarded as including resistors and capacitors as illustrated in FIG. 2A-2. That is, in FIG. 2A-2, the transistor 160 and the capacitor 164 are each regarded as including a resistor and a capacitor. R1 and C1 denote the resistance and the capacitance of the capacitor 164, respectively. The resistance R1 corresponds to the resistance of an insulating layer included in the capacitor 164. R2 and C2 denote the resistance and the capacitance of the transistor 160, respectively. The resistance R2 corresponds to the resistance of a gate insulating layer at the time when the transistor 160 is on. The capacitance C2 corresponds to so-called gate capacitance (capacitance formed between the gate electrode and the source electrode or the drain electrode and capacitance formed between the gate electrode and the channel formation region).

A charge holding period (also referred to as a data holding period) is determined mainly by the off-state current of the transistor 162 under the conditions where gate leakage of the transistor 162 is sufficiently small and the relations R1≤ROS and R2≤ROS are satisfied, where the resistance (also referred to as effective resistance) between the source electrode and the drain electrode in the case where the transistor 162 is off is ROS.

On the other hand, when the conditions are not met, it is difficult to secure a sufficient holding period even if the off-state current of the transistor 162 is low enough. This is because leakage current other than the off-state current of the transistor 162 (e.g., leakage current generated between the source electrode and the gate electrode) is high. Thus, it can be said that the above relations are preferably satisfied in the semiconductor device disclosed in this embodiment.

It is preferable that the relation C1≥C2 be satisfied. This is because when C1 is large, the potential of the fifth wiring can be supplied to the floating gate portion FG efficiently at the time of controlling the potential of the floating gate portion FG by the fifth wiring, and a difference between potentials (e.g., the reading potential and a non-reading potential) supplied to the fifth wiring can be reduced.

When the above relation is satisfied, a more favorable semiconductor device can be realized. Note that R1 and R2 are controlled by the gate insulating layer of the transistor 160 and the insulating layer of the capacitor 164. The same applies to C1 and C2. Therefore, the material, thickness, and the like of the gate insulating layer are preferably set as appropriate to satisfy the above relation.

In the semiconductor device described in this embodiment, the floating gate portion FG has a function similar to that of a floating gate of a floating-gate transistor of a flash memory or the like, but the floating gate portion FG of this embodiment has a feature which is essentially different from that of the floating gate of the flash memory or the like. In the case of a flash memory, since voltage applied to a control gate is high, it is necessary to keep a proper distance between cells in order to prevent the potential from affecting a floating gate of the adjacent cell. This is one of factors inhibiting higher integration of the semiconductor device. The factor is attributed to a basic principle of a flash memory, in which tunneling current is generated by applying a high electric field.

In contrast, the semiconductor device according to this embodiment is operated by switching of a transistor including an oxide semiconductor and does not use the above-described principle of charge injection by tunneling current. That is, a high electric field for charge injection is not necessary unlike a flash memory. Accordingly, it is not necessary to consider an influence of a high electric field from a control gate on an adjacent cell, which facilitates higher integration.

In addition, there is another advantage over a flash memory in that a high electric field and a large peripheral circuit (such as a booster circuit) are unnecessary. For example, the highest voltage applied to the memory cell according to this embodiment (the difference between the highest potential and the lowest potential applied to terminals of the memory cell at the same time) can be 5 V or lower, preferably 3 V or lower in each memory cell in the case where two-level (one-bit) data is written.

In the case where the dielectric constant εr1 of the insulating layer included in the capacitor 164 is different from the dielectric constant εr2 of the insulating layer included in the transistor 160, it is easy to satisfy C1≥C2 while 2≥S2≥S1 (preferably, S2≥S1) is satisfied, where S1 is the area of the insulating layer included in the capacitor 164 and S2 is the area of the insulating layer forming a gate capacitor of the transistor 160. Specifically, for example, a film formed using a high-k material such as hafnium oxide or a stack of a film formed using a high-k material such as hafnium oxide and a film formed using an oxide semiconductor is used for the insulating layer included in the capacitor 164 so that εr1 can be 10 or more, preferably 15 or more; silicon oxide is used for the insulating layer forming the gate capacitor so that εr2 can be 3 to 4.

A combination of such structures enables still higher integration of the semiconductor device according to one embodiment of the present invention.

Note that in addition to the increase in the integration degree, a multilevel technique can be employed in order to increase the storage capacity of the semiconductor device. For example, data of three or more levels is written into one memory cell, whereby the storage capacity can be increased as compared to the case where data of two levels is written. The multilevel technique can be achieved by, for example, giving charge Q to a gate electrode of a first transistor, in addition to the charge $Q_L$ for supply of a low potential and the charge $Q_H$ for supply of a high potential, which are described above. In this case, enough storage capacity can be secured even when a circuit configuration in which $F^2$ is not sufficiently small is employed.

Note that an n-channel transistor in which electrons are majority carriers is used in the above description; needless to say, a p-channel transistor in which holes are majority carriers can be used instead of the n-channel transistor.

As described above, the semiconductor device according to this embodiment is suitable for increasing the integration degree. Note that according to one embodiment of the present invention, a wiring is shared and the contact region is reduced; thus, a semiconductor device whose integration degree is further increased can be provided.

Application Example

An application example of the above semiconductor device will be described with reference to FIG. 3, FIG. 4, FIG. 5, FIG. 6, FIG. 7, FIG. 8, FIG. 9, FIG. 10, FIG. 11, FIG. 12, FIG. 13, FIG. 14, FIG. 15, FIGS. 16A to 16D, FIGS. 17A to 17D, FIGS. 18A to 18D, and FIGS. 19A and 19B.

Figure 3:
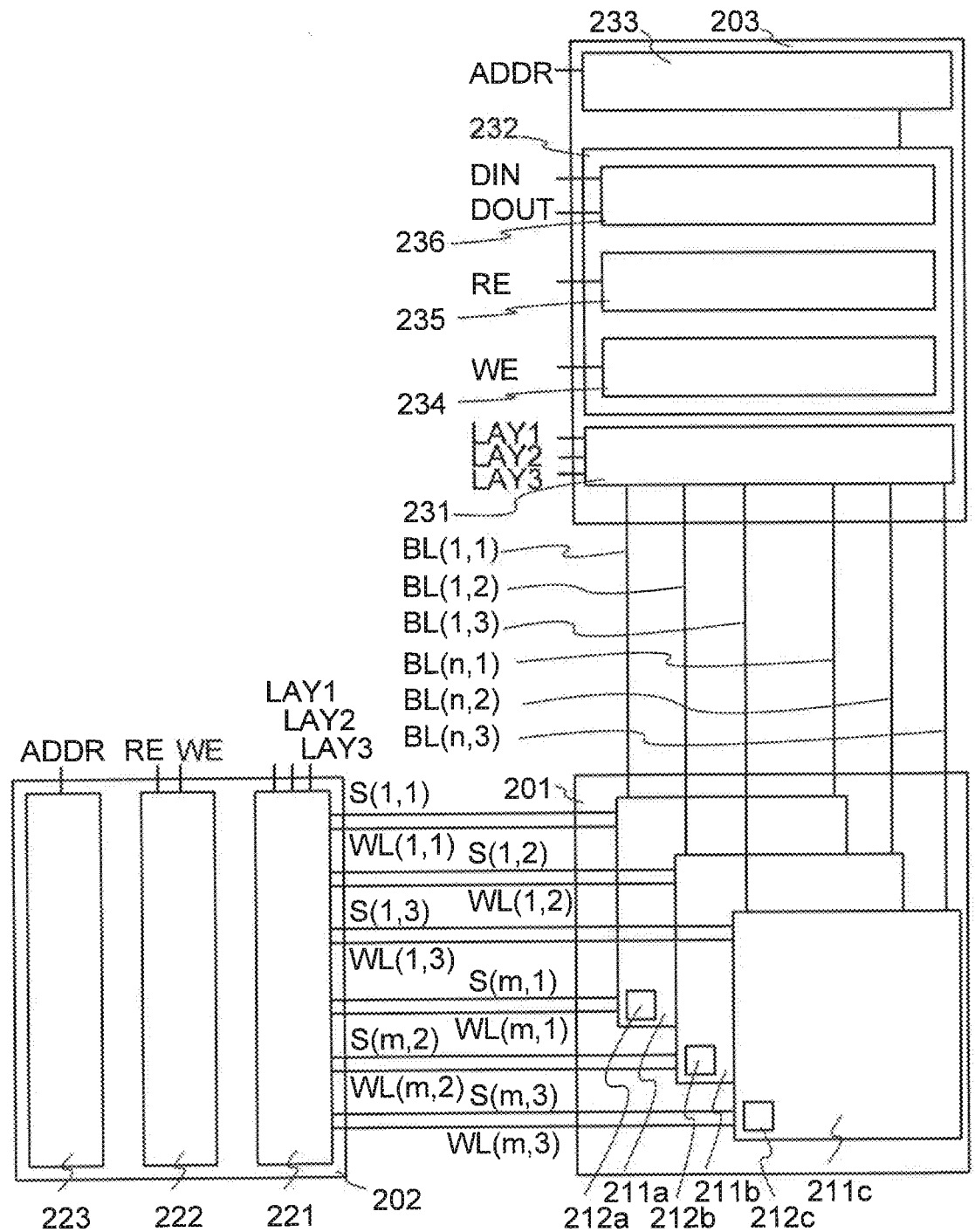
FIG. 3 is a block diagram of a semiconductor device.

FIG. 3 is an example of a block diagram of a semiconductor device. The semiconductor device illustrated in FIG. 3 includes a memory cell array 201, a first driver circuit 202, and a second driver circuit 203.

First, the memory cell array 201 is described. The memory cell array 201 includes memory cell arrays 211a to 211c which are stacked.

The memory cell array 211a includes n (n is an integer of 2 or more) bit lines BL, m (m is an integer of 2 or more) signal lines S, m word lines WL, k (k is a natural number of n or less or a natural number of m or less) source lines SL, and a region in which memory cells 212a are arranged in matrix of m (rows) (in a vertical direction)×n (columns) (in a horizontal direction). Here, the memory cell 212a preferably has the configuration illustrated in FIG. 2A-1. In addition, the signal lines S connected to the memory cell array 211a are denoted by signal lines S (1,1) to S (m,1), and the word lines WL connected to the memory cell array 211a are denoted by word lines WL (1,1) to WL (m,1). The bit lines BL connected to the memory cell array 211a are denoted by bit lines BL (1,1) to BL (n,1).

Each of the memory cells 212a includes a first transistor, a second transistor, and a first capacitor. Here, the memory cell 212a has a structure corresponding to that of the first stack 210a illustrated in FIG. 1. In the memory cell 212a, the first transistor, the second transistor, and the first capacitor correspond to the transistor 160, the transistor 162, and the capacitor 164 in the configuration illustrated in FIG. 2A-1, respectively. In each of the memory cells 212a, a gate electrode of the first transistor, a drain electrode (or a source electrode) of the second transistor, and one electrode of the first capacitor are electrically connected to one another, and the source line SL and a source electrode of the first transistor are electrically connected to each other. Further, the bit line BL, the source electrode (or the drain electrode) of the second transistor, and a drain electrode of the first transistor are electrically connected to one another. The word line WL and the other electrode of the first capacitor are electrically connected to each other. The signal line S and a gate electrode of the second transistor are electrically connected to each other. In other words, the source line SL corresponds to the first wiring (the 1st Line) in the configuration illustrated in FIG. 2A-1, the bit line BL corresponds to the second wiring (the 2nd Line) and the third wiring (the 3rd Line), the signal line S corresponds to the fourth wiring (the 4th Line), and the word line WL corresponds to the fifth wiring (the 5th Line).

The memory cell 212a including the first semiconductor material and the second semiconductor material is used in the memory cell array 211a, whereby the speed of read operation can be increased with a sufficient holding period secured.

The memory cell array 211b includes n (n is an integer of 2 or more) bit lines BL, m (m is an integer of 2 or more) signal lines S, m word lines WL, k (k is a natural number of n or less or a natural number of m or less) source lines SL, and a region in which memory cells 212b are arranged in matrix of m (rows) (in a vertical direction)×n (columns) (in a horizontal direction). Here, the memory cell 212b preferably has the configuration illustrated in FIG. 2B. In addition, the signal lines S connected to the memory cell array 211b are denoted by signal lines S (1,2) to S (m,2), and the word lines WL connected to the memory cell array 211b are denoted by word lines WL (1,2) to WL (m,2). The bit lines BL connected to the memory cell array 211b are denoted by bit lines BL (1,2) to BL (n,2).

Each of the memory cells 212b includes a third transistor, a fourth transistor, and a second capacitor. Here, the memory cell 212b has a structure corresponding to that of the second stack 210b illustrated in FIG. 1. In the memory cell 212b, the third transistor, the fourth transistor, and the second capacitor correspond to the transistor 170, the transistor 172, and the capacitor 174 in the configuration illustrated in FIG. 2B, respectively. In each of the memory cells 212b, a gate electrode of the third transistor, a drain electrode (or a source electrode) of the fourth transistor, and one electrode of the second capacitor are electrically connected to one another, and the source line SL and a source electrode of the third transistor are electrically connected to each other. Further, the bit line BL, the source electrode (or the drain electrode) of the fourth transistor, and a drain electrode of the third transistor are electrically connected to one another. The word line WL and the other electrode of the second capacitor are electrically connected to each other. The signal line S and a gate electrode of the fourth transistor are electrically connected to each other. In other words, the source line SL corresponds to the first wiring (the 1st Line) in the configuration illustrated in FIG. 2B, the bit line BL corresponds to the second wiring (the 2nd Line) and the third wiring (the 3rd Line), the signal line S corresponds to the fourth wiring (the 4th Line), and the word line WL corresponds to the fifth wiring (the 5th Line).

Note that the memory cell array 211c can have a configuration similar to that of the memory cell array 211b and thus is not described in detail. That is, the memory cell array 211c includes a plurality of memory cells 212c. In addition, the signal lines S connected to the memory cell array 211c are denoted by signal lines S (1,3) to S (m,3), and the word lines WL connected to the memory cell array 211c are denoted by word lines WL (1,3) to WL (m,3). The bit lines BL connected to the memory cell array 211c are denoted by bit lines BL (1,3) to BL (n,3).

The memory cell 212b and the memory cell 212c which include the second semiconductor material are used in the memory cell array 211b and the memory cell array 211c, whereby a sufficient data holding period can be secured without making the manufacturing process complicated.

Further, the memory cell arrays 211a to 211c are stacked, whereby higher integration of the semiconductor device can be achieved.

Note that FIG. 3 illustrates the case where the memory cell arrays 211a to 211c are not connected to one another; however, one embodiment of the present invention is not limited to this. For example, the source line SL included in the memory cell array 211a may be electrically connected to the source line SL included in the memory cell array 211b so that the memory cell 212a is electrically connected to the memory cell 212b. Consequently, the number of source lines SL can be reduced. Alternatively, the source line SL connected to the memory cell 212a may be electrically connected the source line SL connected to the memory cell 212b, so that the memory cell 212a can be electrically connected to the memory cell 212b.

In the memory cell arrays 211a to 211c of the semiconductor device illustrated in FIG. 3, the memory cells are arranged in matrix of m (rows) (in a vertical direction)×n (columns) (in a horizontal direction); however, one embodiment of the present invention is not limited to this. The memory cell arrays 211a to 211c do not necessarily have the same memory cell configuration, and can have different memory cell configurations.

The first driver circuit 202 and the second driver circuit 203 each include a plurality of circuits. The first driver circuit 202 includes a selector 221, a circuit 222 including a buffer or the like, and a row decoder 223. The second driver circuit 203 includes a selector 231, a circuit group 232, and a column decoder 233. The circuit group 232 includes a writing circuit group 234, a reading circuit group 235, and a register group 236.

Figure 4:
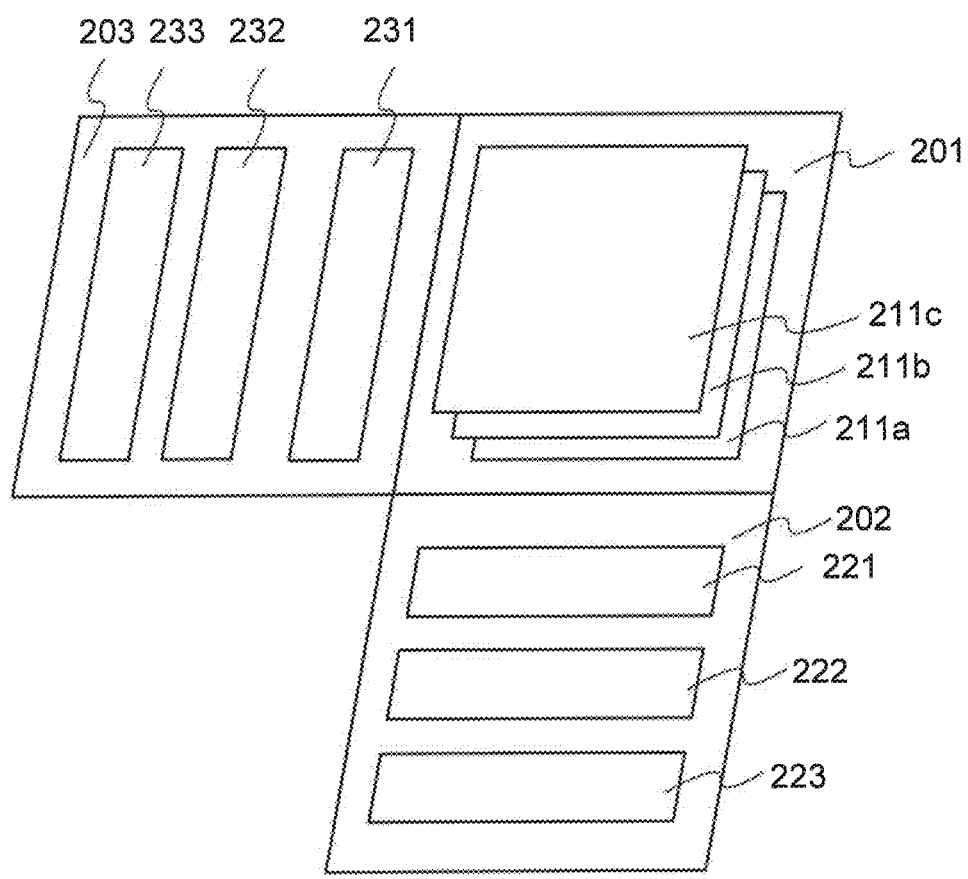
FIG. 4 is a block diagram of a semiconductor device.

Here, FIG. 4 is a simplified block diagram illustrating an example of a stacked structure of the semiconductor device illustrated in FIG. 3. In the semiconductor device illustrated in FIG. 4, the memory cell array 201 includes three stacks, and the first driver circuit 202 and the second driver circuit 203 each include a single stack. The memory cell array 211a is provided in the first stack 210a, the memory cell array 211b is provided in the second stack 210b, and the memory cell array 211c is provided in a stack over the second stack 210b. The first driver circuit 202 and the second driver circuit 203 are provided in the first stack 210a.

Figure 5:
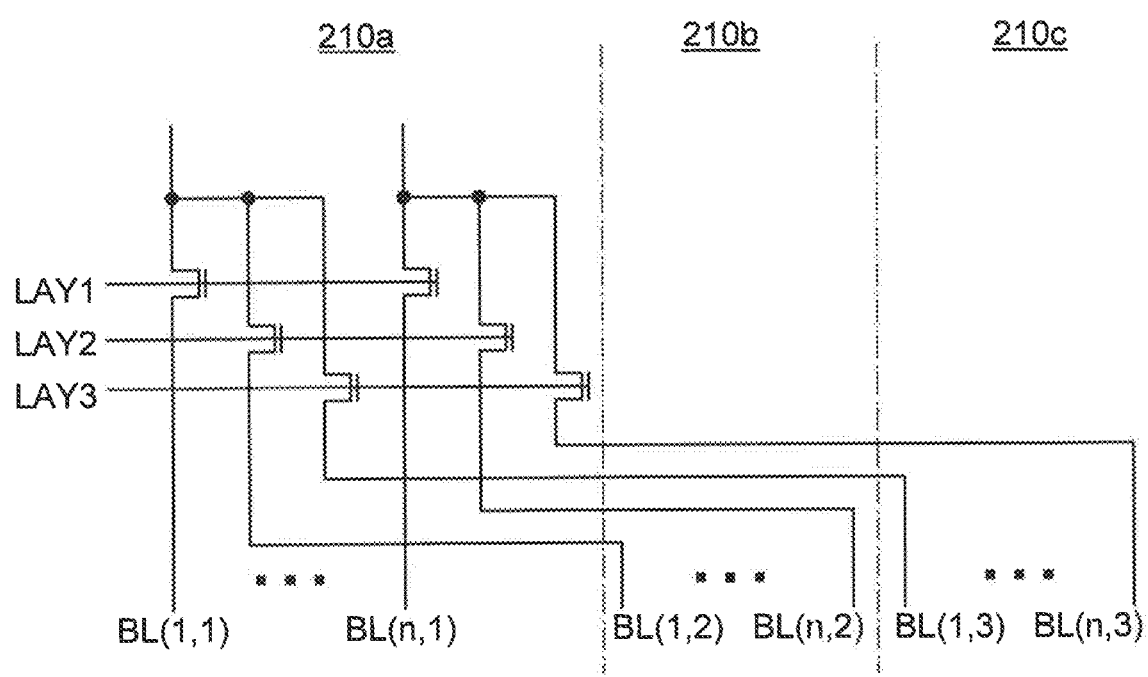
FIG. 5 is a circuit diagram of a semiconductor device.

FIG. 5 is an example of a circuit diagram of the selector 231 in the semiconductor device illustrated in FIG. 3 and FIG. 4. Here, the case where the selector 231 is provided in the first stack 210a is described. The selector 231 includes a plurality of transistors. Further, the selector 231 is connected to the memory cell array 211a through BL (1,1) to BL (n,1). In a similar manner, the selector 231 is connected to the memory cell array 211b through BL (1,2) to BL (n,2) and connected to the memory cell array 211c through BL (1,3) to BL (n,3). The selector 231 electrically connects the bit lines BL to terminals in the circuit group 232 in accordance with layer selection signals LAY1, LAY2, and LAY3. When the signal LAY1 is active, BL (1,1) to BL (n,1) are electrically connected to the terminals in the circuit group 232. When the signal LAY2 is active, BL (1,2) to BL (n,2) are electrically connected to the terminals in the circuit group 232. When the signal LAY3 is active, BL (1,3) to BL (n,3) are electrically connected to the terminals in the circuit group 232.

Figure 6:
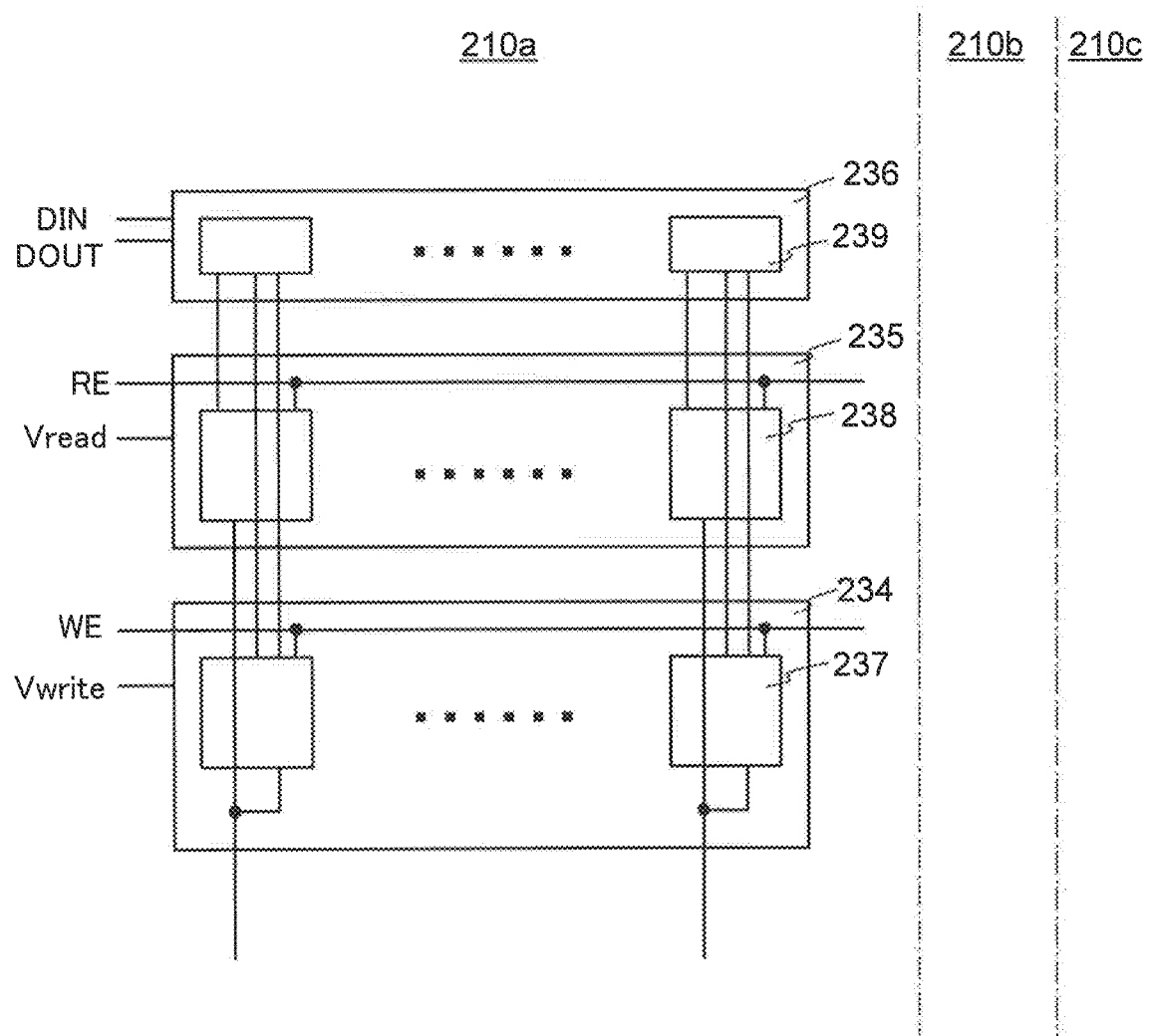
FIG. 6 is a circuit diagram of a semiconductor device.

FIG. 6 is an example of a block diagram of the circuit group 232 in the semiconductor device illustrated in FIG. 3 and FIG. 4. Here, the case where the circuit group 232 is provided in the first stack 210a is described. The circuit group 232 includes the writing circuit group 234, the reading circuit group 235, and the register group 236. The writing circuit group 234 includes a plurality of writing circuits 237. A write enable signal WE, a writing potential Vwrite, and signals output from the register group 236 are input to the writing circuit group 234. Output signals from the plurality of writing circuits 237 are input to the selector 231. The reading circuit group 235 includes reading circuits 238. A read enable signal RE and a reading potential Vread are input to the reading circuit group 235, whose output signals are input to the register group 236. Reading terminals of the reading circuits 238 are connected to the selector 231. Input data DIN is input to the register group 236, and output data DOUT is output from the register group 236. Further, an output signal of the reading circuit group 235 is input to the register group 236, and a signal input to the writing circuit group 234 is output from the register group 236. The signal input to the writing circuit group 234 may be a pair of signals having opposite phases. Note that the numbers of writing circuits 237, reading circuits 238, and registers 239 are each the same as the number of columns of the memory cell array.

Operation of the circuit group 232 illustrated in FIG. 6 is described. The following operations are described: operation in which data is written into the register group 236 from the outside, operation in which data is read from the register group 236 to the outside, operation in which data is written into a memory cell from the register group 236, and operation in which data is read from a memory cell to the register group 236.

Data is written into the register group 236 from the outside by input of the signal DIN to the register group 236. Data is read from the register group 236 to the outside by output of data which is stored in the register group 236 as the signal DOUT. In addition, the operation in which data is written into a memory cell from the register group 236 is performed in such a manner that the writing circuit group 234 selects writing voltage on the basis of a signal output from the register group 236 and outputs the writing voltage during a period in which the write enable signal WE is active. As a result, the writing voltage is supplied to the bit line BL and the data is written into the memory cell. The operation in which data is read from a memory cell to the register group 236 is performed in such a manner that, during a period in which the read enable signal RE is active, the reading circuit group 235 reads data from a memory cell by determining a bit-line potential and outputs the data, and the output data is stored in the register group 236.

Figure 7:
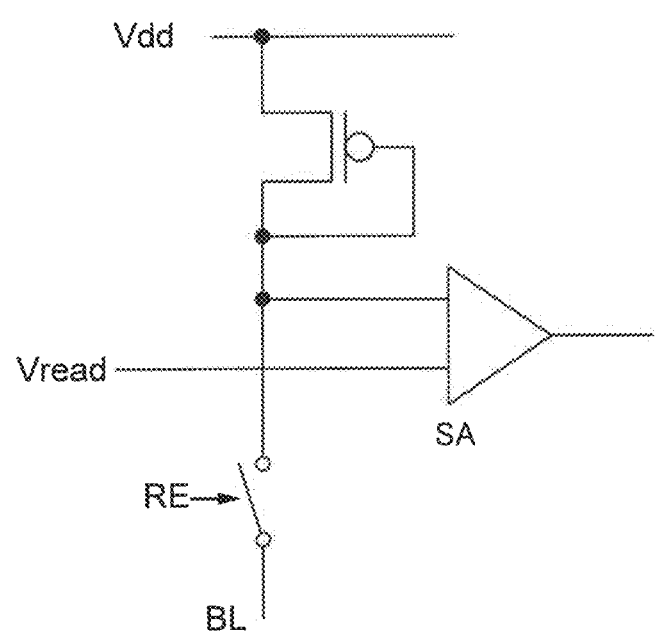
FIG. 7 is a circuit diagram of a semiconductor device.

As the reading circuit 238, for example, a reading circuit illustrated in FIG. 7 can be used. The reading circuit illustrated in FIG. 7 includes a sense amplifier SA, a transistor serving as a load, and a switch. The sense amplifier SA compares a bit-line potential and the reading potential Vread and outputs the comparison result. The read enable signal RE determines whether the reading circuit is electrically connected to the bit line.

Figure 8:
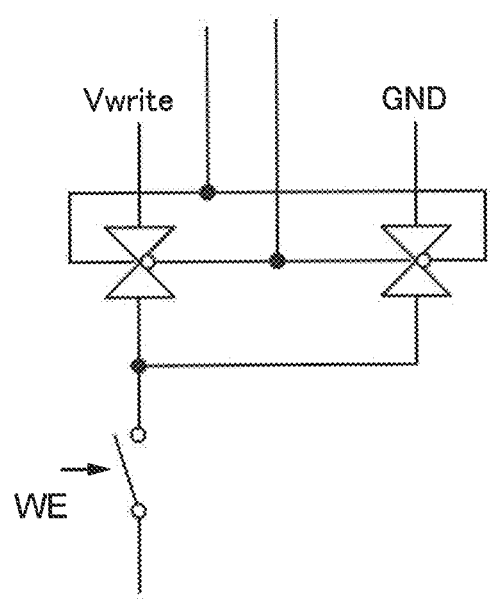
FIG. 8 is a circuit diagram of a semiconductor device.

As the writing circuit 237, for example, a writing circuit illustrated in FIG. 8 can be used. The writing circuit illustrated in FIG. 8 includes three switches. In accordance with a pair of signals having opposite phases, either one of potentials Vwrite and GND is selected. The write enable signal WE determines whether the selected potential is supplied or not.

Figure 9:
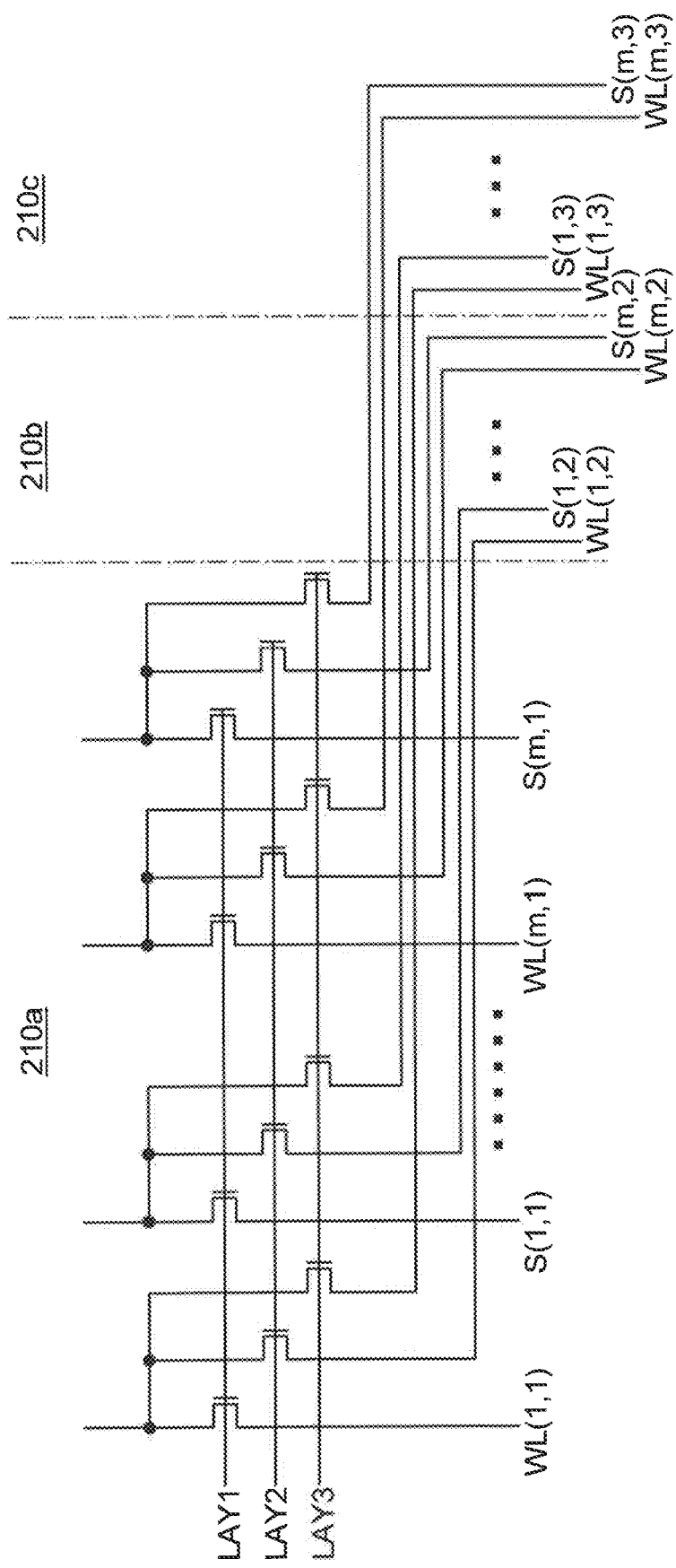
FIG. 9 is a circuit diagram of a semiconductor device.

FIG. 9 is an example of a circuit diagram of the selector 221 in the semiconductor device illustrated in FIG. 3 and FIG. 4. Here, the case where the selector 221 is provided in the first stack 210a is described.

The selector 221 includes a plurality of transistors. Further, the selector 221 is connected to the memory cell array 211a through WL (1,1) to WL (m,1) and S (1,1) to S (m,1). In a similar manner, the selector 221 is connected to the memory cell array 211b through WL (1,2) to WL (m,2) and S (1,2) to S (m,2) and connected to the memory cell array 211c through WL (1,3) to WL (m,3) and S (1,3) to S (m,3). The selector 221 electrically connects the word lines WL and the signal lines S to terminals in the circuit 222 in accordance with the layer selection signals LAY1, LAY2, and LAY3. When the signal LAY1 is active, WL (1,1) to WL (m,1) and S (1,1) to S (m,1) are electrically connected to the terminals in the circuit 222. When the signal LAY2 is active, WL (1,2) to WL (m,2) and S (1,2) to S (m,2) are electrically connected to the terminals in the circuit 222. When the signal LAY3 is active, WL (1,3) to WL (m,3) and S (1,3) to S (m,3) are electrically connected to the terminals in the circuit 222.

By forming circuits provided in the first driver circuit 202 and the second driver circuit 203 with the use of the first semiconductor material, the first driver circuit 202 and the second driver circuit 203 can operate at high speed.

Figure 10:
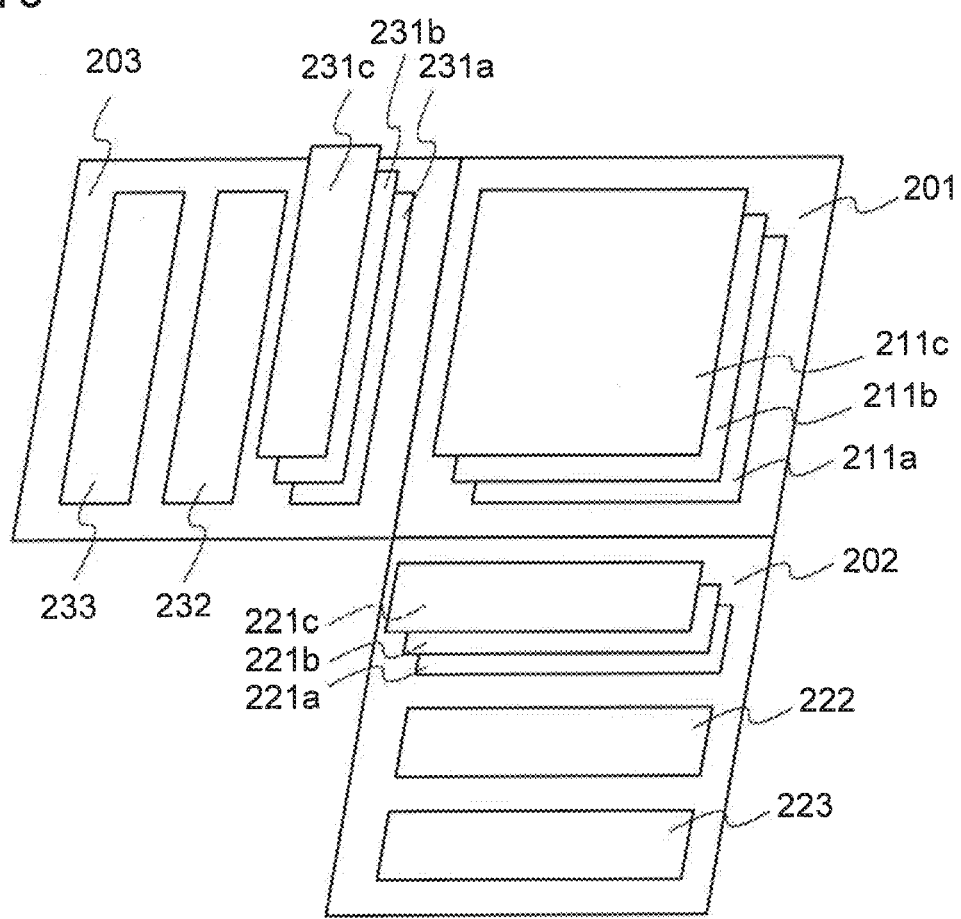
FIG. 10 is a block diagram of a semiconductor device.

FIG. 10 is a simplified block diagram illustrating another example of a stacked structure of the semiconductor device illustrated in FIG. 3. In the semiconductor device illustrated in FIG. 10, the memory cell array 201 includes three stacks, selectors 221a, 221b, and 221c included in the first driver circuit 202 are three stacks, selectors 231a, 231b, and 231c included in the second driver circuit 203 are three stacks, and the other circuits in the first driver circuit 202 and the second driver circuit 203 each include a single stack. The memory cell array 211a, the selector 221a, and the selector 231a are provided in the first stack 210a. The memory cell array 211b, the selector 221b, and the selector 231b are provided in the second stack 210b. The memory cell array 211c, the selector 221c, and the selector 231c are provided in a third stack 210c.

Figure 11:
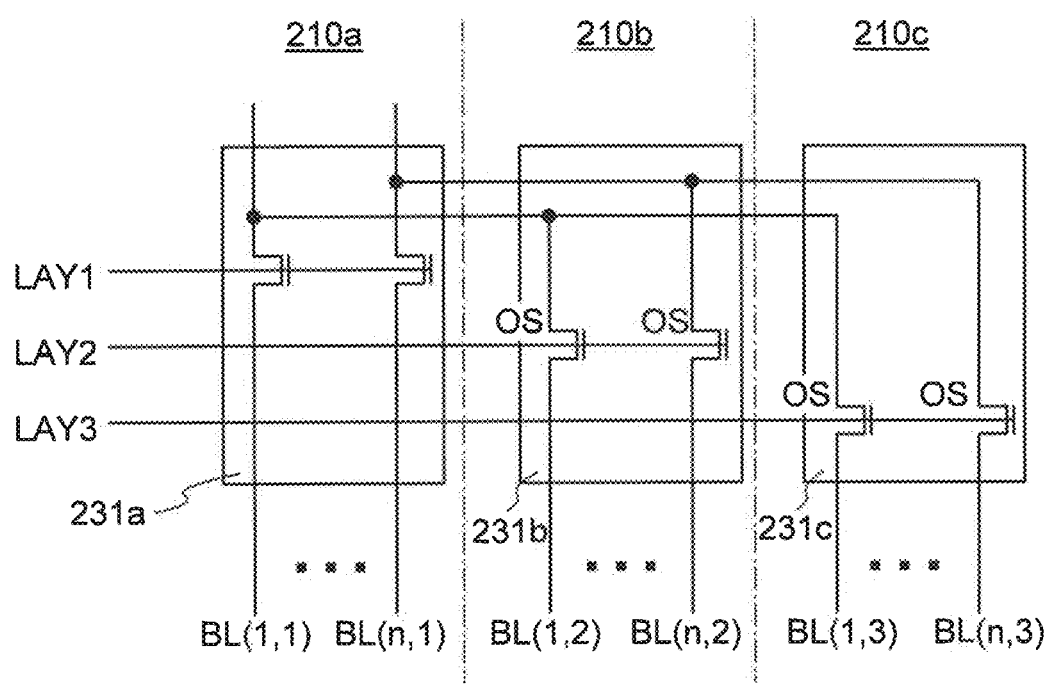
FIG. 11 is a circuit diagram of a semiconductor device.

FIG. 11 is an example of a circuit diagram of the selectors 231a, 231b, and 231c in the second driver circuit 203 of the semiconductor device illustrated in FIG. 10. The selectors illustrated in FIG. 11 have a circuit configuration similar to that of the selector illustrated in FIG. 5. A stacked structure of the selector is different between FIG. 5 and FIG. 11. The transistors included in the selector are provided in the first stack 210a in FIG. 5, whereas transistors included in the selectors are provided in three layers in FIG. 11. For example, in the second driver circuit 203, the selector 231a is formed in the same layer as the memory cell array 211a, the selector 231b is formed in the same layer as the memory cell array 211b, and the selector 231c is formed in the same layer as the memory cell array 211c. In other words, in the second driver circuit 203, the selector 231a includes the first semiconductor material, and the selector 231b and the selector 231c include the second semiconductor material.

The circuit group 232 of the semiconductor device illustrated in FIG. 10 may have the same circuit configuration and stacked structure as the circuit group 232 of the semiconductor device illustrated in FIG. 4. The example of the block diagram of FIG. 6 can be referred to for the details.

Figure 12:
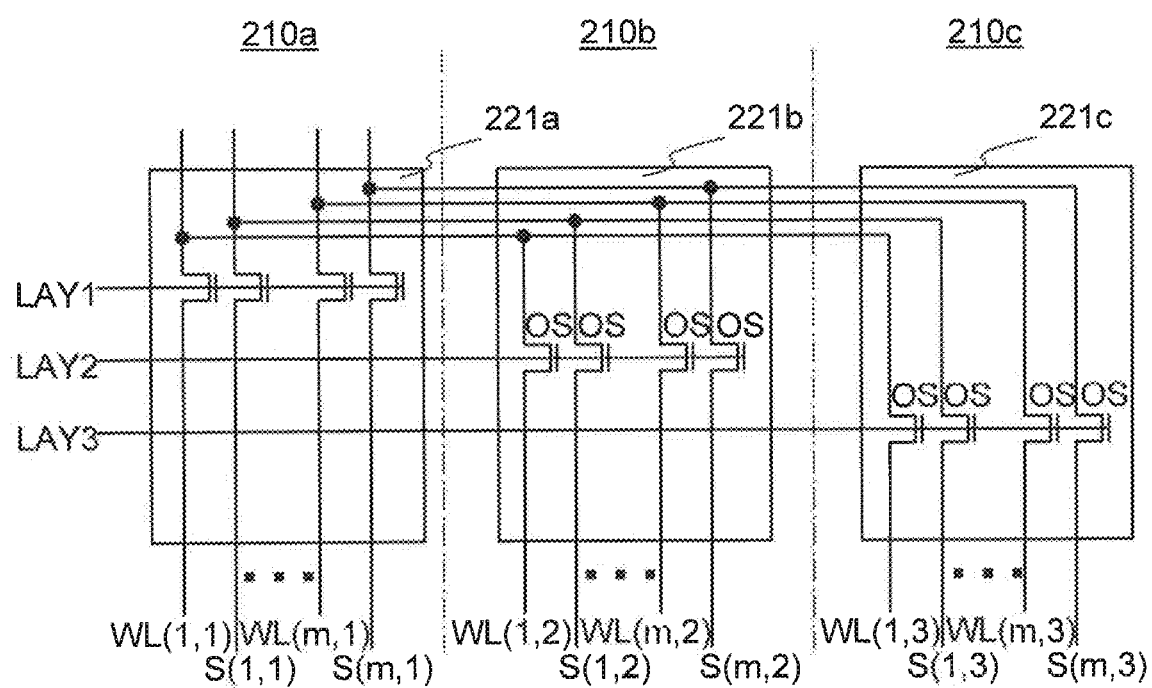
FIG. 12 is a circuit diagram of a semiconductor device.

FIG. 12 is an example of a circuit diagram of the selectors 221a, 221b, and 221c in the first driver circuit 202 of the semiconductor device illustrated in FIG. 10. The selectors illustrated in FIG. 12 have a circuit configuration similar to that of the selector illustrated in FIG. 9. A stacked structure of the selector is different between FIG. 9 and FIG. 12. The transistors included in the selector are provided in the first stack 210a in FIG. 9, whereas transistors included in the selectors are provided in three layers in FIG. 12. For example, in the first driver circuit 202, the selector 221a is formed in the same layer as the memory cell array 211a, the selector 221b is formed in the same layer as the memory cell array 211b, and the selector 221c is formed in the same layer as the memory cell array 211c. In other words, in the first driver circuit 202, the selector 221a includes the first semiconductor material, and the selector 221b and the selector 221c include the second semiconductor material.

With such a configuration, the area occupied by a driver circuit can be reduced and the memory density can be increased. Further, an increase in the area of a memory cell array leads to higher storage capacity.

Figure 13:
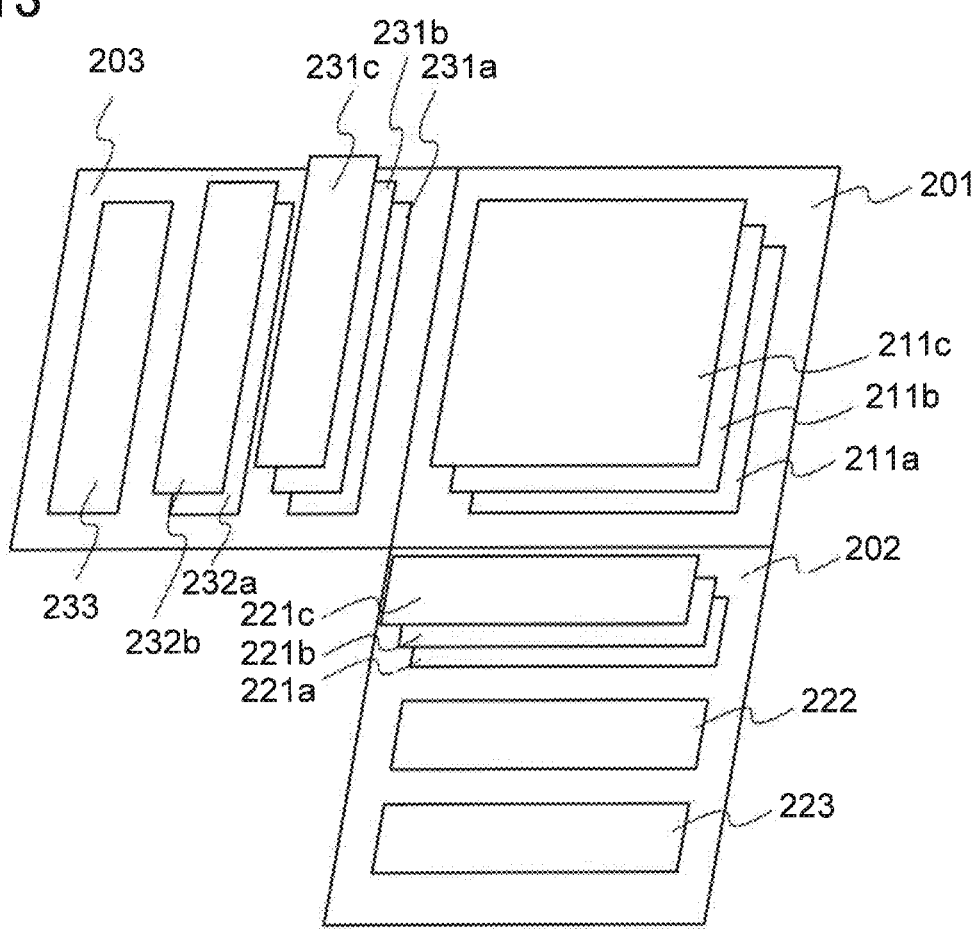
FIG. 13 is a block diagram of a semiconductor device.

FIG. 13 is a simplified block diagram illustrating another example of a stacked structure of the semiconductor device illustrated in FIG. 3. In the semiconductor device illustrated in FIG. 13, the memory cell array 201 includes three stacks, and the first driver circuit 202 and the second driver circuit 203 each partly have a stacked structure including plural layers. The memory cell array 211a, the selector 221a, the selector 231a, and a circuit group 232a are provided in the first stack 210a. The memory cell array 211b, the selector 221b, the selector 231b, and a circuit group 232b are provided in the second stack 210b. The memory cell array 211c, the selector 221c, and the selector 231c are provided in the third stack 210c.

The structure of the second driver circuit 203 is different between FIG. 10 and FIG. 13. For example, the circuit group 232 in the second driver circuit 203 has a single-layer structure in FIG. 10, whereas the circuit groups 232a and 232b in the second driver circuit 203 form a two-layer stacked structure in FIG. 13.

The selectors 231a, 231b, and 231c and the selectors 221a, 221b, and 221c of the semiconductor device illustrated in FIG. 13 may have the same circuit configurations and stacked structures as the selectors 231a, 231b, and 231c and the selectors 221a, 221b, and 221c of the semiconductor device illustrated in FIG. 10. The examples of the block diagrams of FIG. 11 and FIG. 12 can be referred to for the details.

Figure 14:
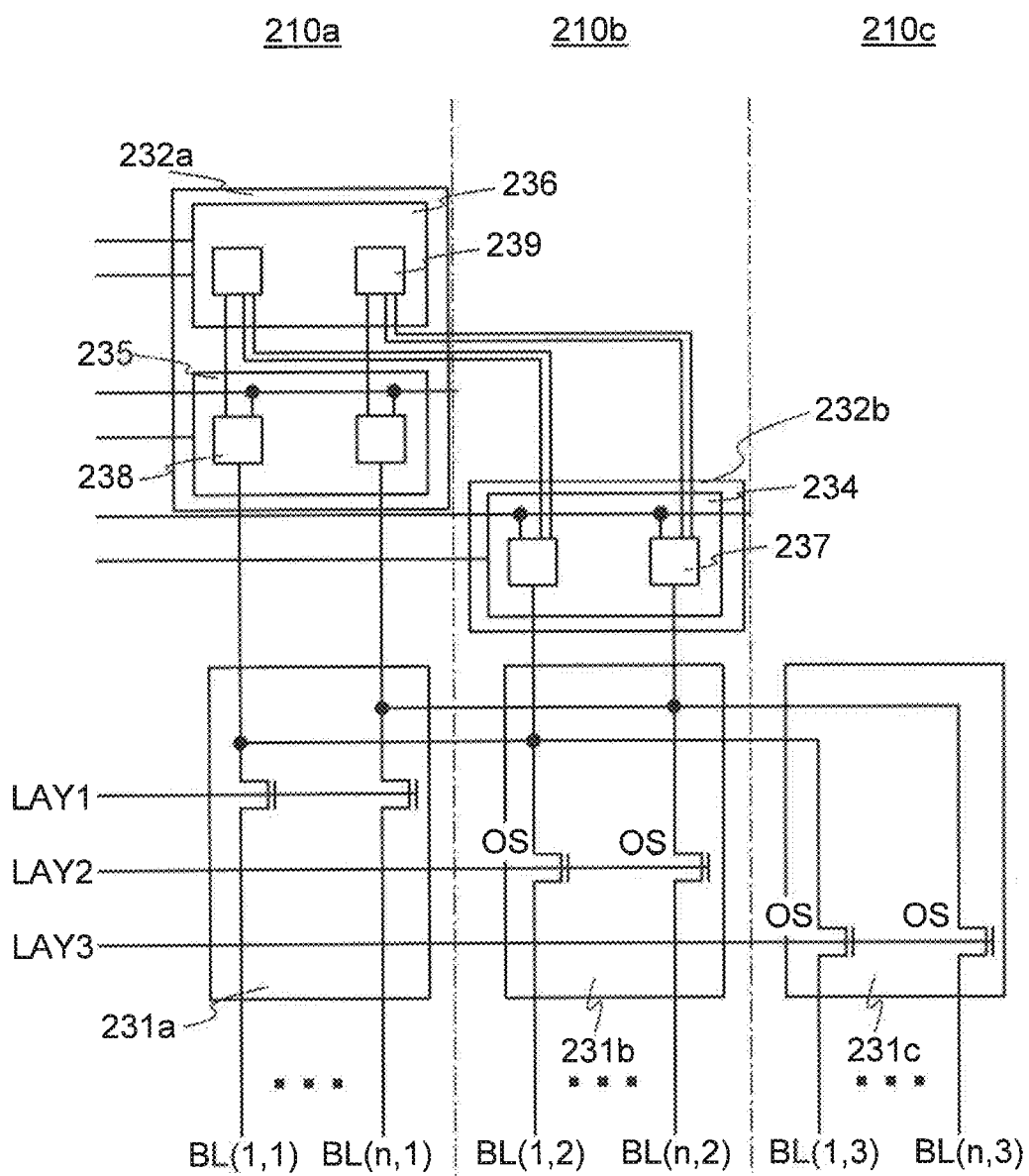
FIG. 14 is a circuit diagram of a semiconductor device.
Figure 15:
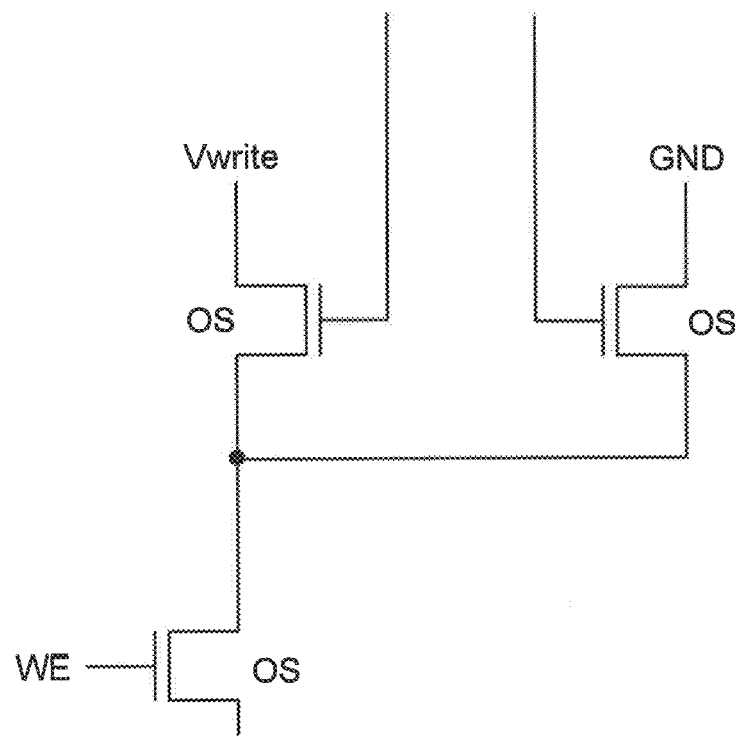
FIG. 15 is a circuit diagram of a semiconductor device.

FIG. 14 is an example of a circuit diagram of the circuit groups 232a and 232b and the selectors 231a, 231b, and 231c in the second driver circuit 203 of the semiconductor device illustrated in FIG. 13. The circuit groups 232a and 232b illustrated in FIG. 14 have a circuit configuration similar to that of the circuit group 232 illustrated in FIG. 6.

A stacked structure is different between the circuit group 232 illustrated in FIG. 6 and the circuit groups 232a and 232b illustrated in FIG. 14. Transistors included in the circuit group 232 are provided in the first stack 210a in FIG. 6, whereas transistors included in the circuit groups 232a and 232b are provided in two layers in FIG. 14. For example, in the second driver circuit 203, the circuit group 232a is formed in the same layer as the memory cell array 211a, and the circuit group 232b is formed in the same layer as the memory cell array 211b. In other words, in the second driver circuit 203, the circuit group 232a includes the first semiconductor material, and the circuit group 232b includes the second semiconductor material.

The circuit group 232a illustrated in FIG. 14 includes the register group 236 and the reading circuit group 235. The circuit group 232b illustrated in FIG. 14 includes the writing circuit group 234. As a reading circuit included in the reading circuit group 235, for example, the reading circuit illustrated in FIG. 7 can be used. As a writing circuit included in the writing circuit group 234, for example, a writing circuit illustrated in FIG. 15 can be used. The writing circuit illustrated in FIG. 15 includes three transistors including the second semiconductor material. In accordance with a pair of signals having opposite phases, either one of potentials Vwrite and GND is selected. The write enable signal WE determines whether the selected potential is supplied or not.

With such a configuration, the area occupied by a driver circuit can be reduced and the memory density can be increased. Further, an increase in the area of a memory cell array leads to higher storage capacity.

In this embodiment, an example in which the memory cell array 201, the first driver circuit 202, or the second driver circuit 203 has a three-layer stacked structure is described; however, one embodiment of the present invention is not limited to this. A stacked structure including two layers or a stacked structure including four or more layers can be employed.

<Method for Manufacturing Semiconductor Device>

Next, an example of a method for manufacturing the above semiconductor device will be described. First, a method for manufacturing the transistor 160 in the lower portion in the first stack 210a will be described below with reference to FIGS. 16A to 16D and FIGS. 17A to 17D; then, a method for manufacturing the transistor 162 and the capacitor 164 in the upper portion will be described with reference to FIGS. 18A to 18D and FIGS. 19A and 19B. Note that a method for manufacturing the transistor 170, the transistor 172, and the capacitor 174 in the second stack 210b is similar to the method for manufacturing the transistor 162 and the capacitor 164, and thus is not described in detail.

<Method for Manufacturing Transistor in Lower Portion>

A method for manufacturing the transistor 160 in the lower portion will be described with reference to FIGS. 16A to 16D and FIGS. 17A to 17D.

First, the substrate 100 including a semiconductor material is prepared. As the substrate including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Here, an example of using a single crystal silicon substrate as the substrate 100 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface. That is, a semiconductor layer included in the "SOI substrate" is not limited to a silicon-based semiconductor layer. Moreover, the SOI substrate can be a substrate having a structure in which a semiconductor layer is provided over an insulating substrate such as a glass substrate with an insulating layer positioned therebetween.

It is preferable that a single crystal semiconductor substrate such as a silicon wafer be used as the substrate 100 including a semiconductor material because the speed of read operation of the semiconductor device can be increased.

Figure 16A:
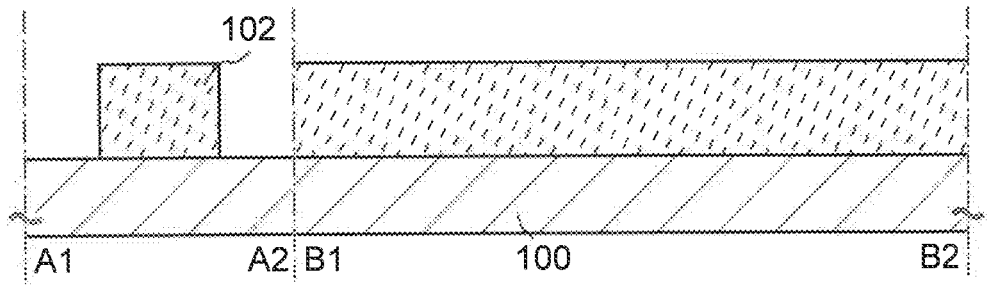
FIGS. 16A to 16D are cross-sectional views illustrating a manufacturing process of a semiconductor device.
Figure 16B:
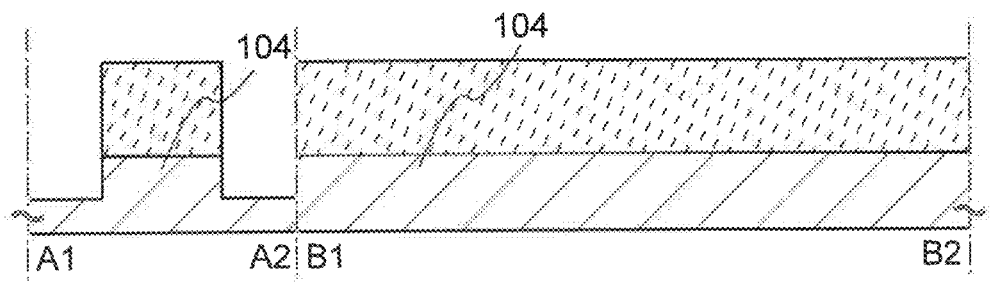

A protective layer 102 serving as a mask for forming an element isolation insulating layer is formed over the substrate 100 (see FIG. 16A). As the protective layer 102, for example, an insulating layer formed using silicon oxide, silicon nitride, silicon oxynitride, or the like can be used. Note that before or after this step, an impurity element imparting n-type conductivity or an impurity element imparting p-type conductivity may be added to the substrate 100 in order to control the threshold voltage of the transistor. In the case where silicon is used as the semiconductor, phosphorus, arsenic, or the like can be used as the impurity element imparting n-type conductivity, for example. Boron, aluminum, gallium, or the like can be used as the impurity element imparting p-type conductivity, for example.

Next, part of the substrate 100 in a region that is not covered with the protective layer 102 (in an exposed region) is removed by etching with the use of the protective layer 102 as a mask. Thus, a semiconductor region 104 isolated from the other semiconductor regions is formed (see FIG. 16B). As the etching, dry etching is preferably performed, but wet etching may be performed. An etching gas or an etchant can be selected as appropriate in accordance with a material to be etched.

Figure 16C:
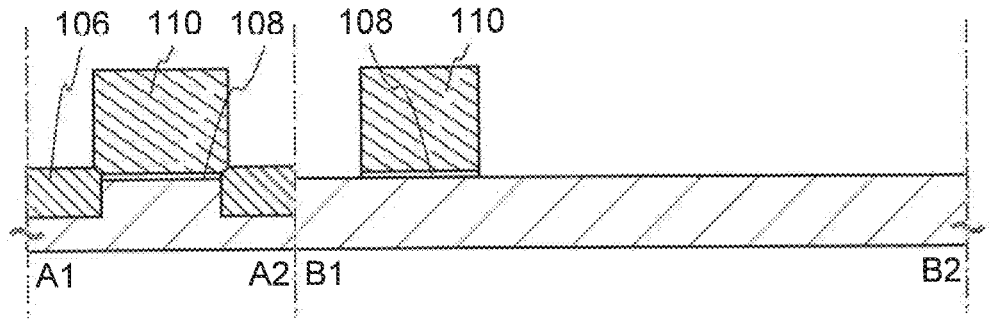

Next, an insulating layer is formed so as to cover the semiconductor region 104 and the insulating layer in a region overlapping with the semiconductor region 104 is selectively removed, so that the element isolation insulating layer 106 is formed (see FIG. 16C). The insulating layer is formed using silicon oxide, silicon nitride, silicon oxynitride, or the like. As a method for removing the insulating layer, any of etching treatment, polishing treatment such as chemical mechanical polishing (CMP), and the like may be employed. Note that the protective layer 102 is removed after the formation of the semiconductor region 104 or after the formation of the element isolation insulating layer 106.

Here, the CMP treatment is a method for planarizing a surface of an object to be processed by a combination of chemical and mechanical actions with the use of the surface as a reference. Specifically, the CMP treatment is a method in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by an action of mechanical polishing of the object to be processed with the polishing cloth.

Note that as a method for forming the element isolation insulating layer 106, a method in which an insulating region is formed by introduction of oxygen, or the like can be used instead of the method in which the insulating layer is selectively removed.

Next, an insulating layer is formed over a surface of the semiconductor region 104, and a layer including a conductive material is formed over the insulating layer.

The insulating layer is to be a gate insulating layer later and can be formed by performing heat treatment (such as thermal oxidation treatment or thermal nitridation treatment) on the surface of the semiconductor region 104, for example. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, hydrogen, and the like. Needless to say, the insulating layer may be formed by a CVD method, a sputtering method, or the like. The insulating layer preferably has a single-layer structure or a stacked structure including any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, and the like. The thickness of the insulating layer can be, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the formation method, and a variety of film formation methods such as an evaporation method, a CVD method, a sputtering method, and a spin coating method can be employed. Note that an example in which the layer including a conductive material is formed using a metal material is described in this embodiment.

After that, the insulating layer and the layer including a conductive material are selectively etched, so that the gate insulating layer 108 and the gate electrode 110 are formed (see FIG. 16C).

Figure 16D:
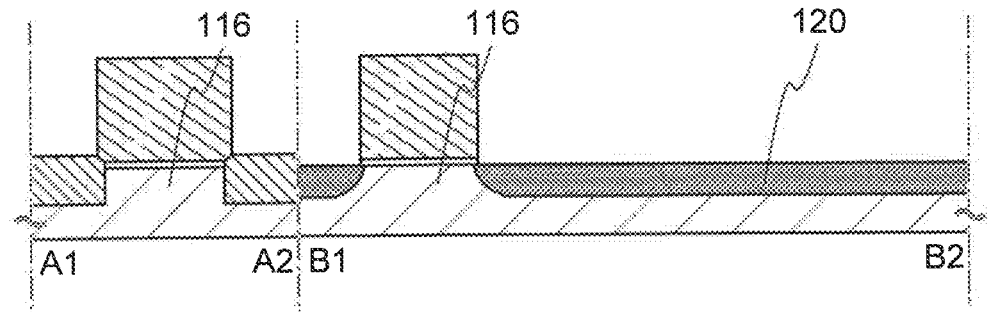

Next, phosphorus (P), arsenic (As), or the like is added to the semiconductor region 104, so that the channel formation region 116 and the impurity regions 120 are formed (see FIG. 16D). Note that phosphorus or arsenic is added here in order to form an n-channel transistor; an impurity element such as boron (B) or aluminum (Al) may be added in the case of forming a p-channel transistor. Here, the concentration of the impurity added can be set as appropriate; the concentration is preferably high when a semiconductor element is highly miniaturized.

Note that a sidewall insulating layer may be formed in the periphery of the gate electrode 110 so that an impurity region to which an impurity element is added at a different concentration may be formed.

Figure 17A:
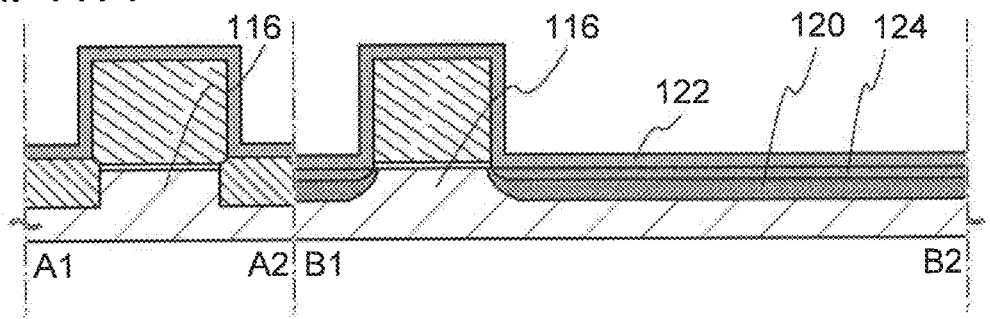
FIGS. 17A to 17D are cross-sectional views illustrating a manufacturing process of a semiconductor device.

Then, a metal layer 122 is formed so as to cover the gate electrode 110, the impurity regions 120, and the like (see FIG. 17A). A variety of film formation methods such as a vacuum evaporation method, a sputtering method, and a spin coating method can be employed for forming the metal layer 122. The metal layer 122 is preferably formed using a metal material that reacts with a semiconductor material included in the semiconductor region 104 to form a low-resistance metal compound. Examples of such a metal material include titanium, tantalum, tungsten, nickel, cobalt, and platinum.

Next, heat treatment is performed so that the metal layer 122 reacts with the semiconductor material. Thus, the metal compound regions 124 that are in contact with the impurity regions 120 are formed (see FIG. 17A). Note that in the case where the gate electrode 110 is formed using polycrystalline silicon or the like, a metal compound region is also formed in a portion of the gate electrode 110 in contact with the metal layer 122.

As the heat treatment, irradiation with a flash lamp can be employed, for example. Needless to say, another heat treatment method may be used; however, a method by which heat treatment for an extremely short time can be achieved is preferably used in order to improve the controllability of chemical reaction in formation of the metal compound. Note that the metal compound regions are formed by reaction between the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 17B:
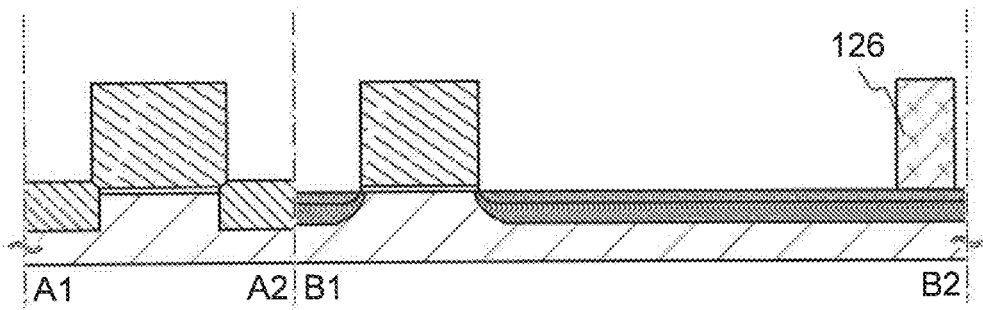

Next, the electrode 126 is formed in a region in contact with part of the metal compound region 124 (see FIG. 17B). The electrode 126 is formed by, for example, forming a layer including a conductive material and then selectively etching the layer. The layer including a conductive material can be formed using a metal material such as aluminum, copper, titanium, tantalum, or tungsten. The layer including a conductive material may be formed using a semiconductor material such as polycrystalline silicon. There is no particular limitation on the formation method, and a variety of film formation methods such as an evaporation method, a CVD method, a sputtering method, and a spin coating method can be employed.

Figure 17C:
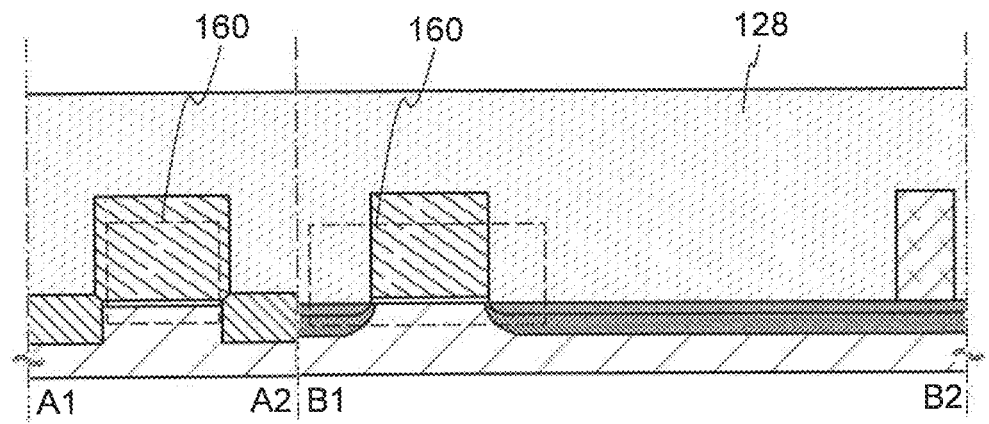

Then, the insulating layer 128 is formed so as to cover the components formed in the above steps (see FIG. 17C). The insulating layer 128 can be formed using a material including an inorganic insulating material such as silicon oxide, silicon oxynitride, silicon nitride, or aluminum oxide. In particular, a material with a low dielectric constant (a low-k material) is preferably used for the insulating layer 128, because capacitance due to overlap of electrodes or wirings can be sufficiently reduced. Note that the insulating layer 128 may be a porous insulating layer formed using any of those materials. A porous insulating layer has a lower dielectric constant than a dense insulating layer, and thus allows a further reduction in capacitance due to electrodes or wirings. Further, the insulating layer 128 can be formed using an organic insulating material such as polyimide or acrylic. Note that although the insulating layer 128 has a single-layer structure here, one embodiment of the present invention is not limited to this. The insulating layer 128 may have a stacked structure including two or more layers. In the case of a three-layer structure, for example, a stacked structure of a silicon oxynitride layer, a silicon nitride oxide layer, and a silicon oxide layer can be employed.

Note that the electrode 126 can be formed so as to fill an opening which is formed in the insulating layer 128 to reach the metal compound region 124 after the formation of the insulating layer 128.

In that case, for example, it is possible to employ a method in which a thin titanium film is formed in a region including the opening by a PVD method and a thin titanium nitride film is formed by a CVD method, and then a tungsten film is formed so as to be embedded in the opening. Here, the titanium film formed by a PVD method has a function of reducing an oxide film (such as a natural oxide film) formed on a surface over which the titanium film is formed, thereby lowering the contact resistance with a lower electrode or the like (the metal compound region 124, here). The titanium nitride film formed after the formation of the titanium film has a barrier function of preventing diffusion of the conductive material. A copper film may be formed by a plating method after the formation of the barrier film of titanium, titanium nitride, or the like.

Through the above steps, the transistor 160 is formed with the use of the substrate 100 including a semiconductor material (see FIG. 17C). Thus, the stack 213a can be formed. A feature of the transistor 160 is that it can operate at high speed. Therefore, when the transistor is used as a reading transistor, data can be read at high speed.

Figure 17D:
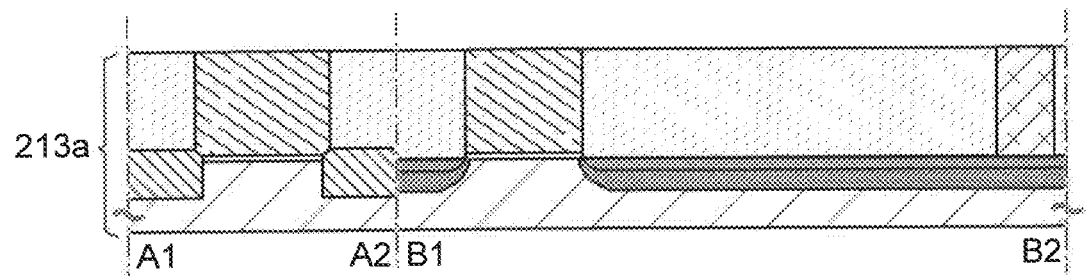

After that, CMP treatment is performed on the insulating layer 128 as pretreatment for the formation of the transistor 162 and the capacitor 164, so that upper surfaces of the gate electrode 110 and the electrode 126 are exposed (see FIG. 17D). As treatment for exposing the upper surfaces of the gate electrode 110 and the electrode 126, etching treatment or the like can be employed instead of CMP treatment; in order to improve characteristics of the transistor 162, the surface of the insulating layer 128 is preferably made as flat as possible.

Note that before or after the above steps, a step of forming an additional electrode, wiring, semiconductor layer, insulating layer, or the like may be performed. For example, a multilayer wiring structure in which an insulating layer and a conductive layer are stacked is employed as a wiring structure, whereby a highly integrated semiconductor device can be provided.

The above steps are described as a method for manufacturing the transistor 160 as a transistor in the lower portion; at the time of manufacturing the transistor in the lower portion, the first driver circuit 202 and the second driver circuit 203 illustrated in FIG. 3, FIG. 4, and the like can be manufactured.

<Method for Manufacturing Transistor in Upper Portion>

Next, a method for manufacturing the transistor 162 and the capacitor 164 in the upper portion will be described with reference to FIGS. 18A to 18D and FIGS. 19A and 19B.

Figure 18A:
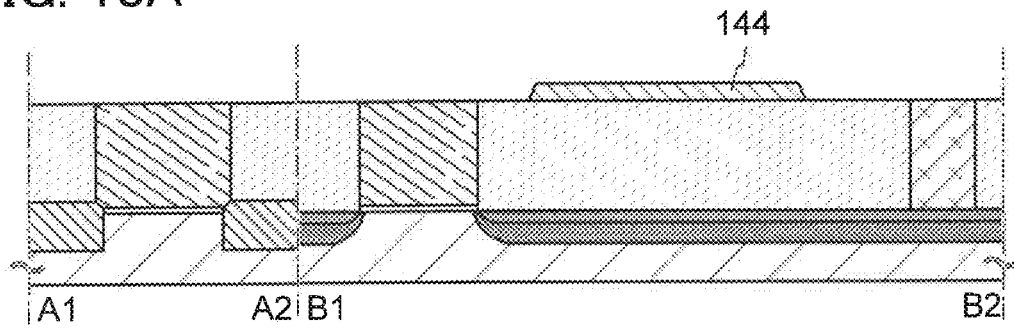
FIGS. 18A to 18D are cross-sectional views illustrating a manufacturing process of a semiconductor device.

First, an oxide semiconductor layer is formed over the gate electrode 110, the electrode 126, the insulating layer 128, and the like and is processed, so that the oxide semiconductor layer 144 is formed (see FIG. 18A). Note that an insulating layer functioning as a base may be provided over the gate electrode 110, the electrode 126, and the insulating layer 128 before the oxide semiconductor layer is formed. The insulating layer can be formed by a PVD method typified by a sputtering method, a CVD method such as a plasma CVD method, or the like.

As a material used for the oxide semiconductor layer, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like can be used. In addition, the above materials may include $SiO_2$. Here, for example, an In—Ga—Zn—O-based material means an oxide semiconductor including indium (In), gallium (Ga), and zinc (Zn), and there is no particular limitation on the composition ratio thereof. Further, the In—Ga—Zn—O-based material may include an element other than In, Ga, and Zn.

As the oxide semiconductor layer, a thin film including a material expressed as the chemical formula, $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

The thickness of the oxide semiconductor layer is preferably greater than or equal to 3 nm and less than or equal to 30 nm. This is because the transistor might be normally on when the oxide semiconductor layer is too thick (e.g., the thickness is 50 nm or more).

The oxide semiconductor layer is preferably formed by a method with which impurities such as hydrogen, water, a hydroxyl group, and hydride do not easily enter the oxide semiconductor layer. For example, a sputtering method or the like can be used.

In this embodiment, the oxide semiconductor layer is formed by a sputtering method using an In—Ga—Zn—O-based oxide target.

In the case where an In—Ga—Zn—O-based material is used as the oxide semiconductor, for example, an oxide target having a composition ratio of $In_2O_3$:$Ga_2O_3$:ZnO=1:1:1 [molar ratio] can be used. Note that it is not necessary to limit the material and composition ratio of the target to the above. For example, an oxide target having a composition ratio of $In_2O_3$:$Ga_2O_3$:ZnO=1:1:2 [molar ratio] can be used.

In the case where an In—Zn—O-based material is used as the oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation Z>1.5X+Y is satisfied.

The filling rate of the target is higher than or equal to 90% and lower than or equal to 100%, preferably higher than or equal to 95% and lower than or equal to 99.9%. With the use of the target with a high filling rate, the oxide semiconductor layer can be a dense film.

The deposition atmosphere may be a rare gas (typically argon) atmosphere, an oxygen atmosphere, a mixed atmosphere including a rare gas and oxygen, or the like. Moreover, it is preferable to employ an atmosphere using a high-purity gas from which impurities such as hydrogen, water, a hydroxyl group, and hydride are sufficiently removed so that entry of hydrogen, water, a hydroxyl group, hydride, and the like into the oxide semiconductor layer can be prevented.

For example, the oxide semiconductor layer can be formed as follows.

First, the substrate is held in a deposition chamber which is kept under reduced pressure, and then heating is performed so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas from which impurities such as hydrogen, water, a hydroxyl group, and hydride are sufficiently removed is introduced while moisture remaining in the deposition chamber is removed, and the oxide semiconductor layer is formed over the substrate with the use of the above target. In order to remove moisture remaining in the deposition chamber, an entrapment vacuum pump such as a cryopump, an ion pump, or a titanium sublimation pump is preferably used as an evacuation unit. The evacuation unit may be a turbo pump provided with a cold trap. In the deposition chamber which is evacuated with the cryopump, for example, impurities such as hydrogen, water, a hydroxyl group, and hydride (preferably, also a compound including a carbon atom) and the like are removed, whereby the concentration of impurities such as hydrogen, water, a hydroxyl group, and hydride in the oxide semiconductor layer formed in the deposition chamber can be reduced.

In the case where the substrate temperature is low (e.g., 100° C. or lower) during deposition, a substance including a hydrogen atom might enter the oxide semiconductor; thus, it is preferable that the substrate be heated at the above temperature. When the oxide semiconductor layer is formed with the substrate heated at the above temperature, the substrate temperature is high, so that hydrogen bonds are cut by heat and the substance including a hydrogen atom is less likely to be taken into the oxide semiconductor layer. Therefore, the oxide semiconductor layer is formed with the substrate heated at the above temperature, whereby the concentration of impurities such as hydrogen, water, a hydroxyl group, and hydride in the oxide semiconductor layer can be sufficiently reduced. Moreover, damage due to sputtering can be reduced.

An example of the deposition conditions is as follows: the distance between the substrate and the target is 60 mm, the pressure is 0.4 Pa, the direct-current (DC) power is 0.5 kW, the substrate temperature is 400° C., and the deposition atmosphere is an oxygen atmosphere (the proportion of oxygen flow is 100%). Note that a pulsed direct-current power source is preferable because powder substances (also referred to as particles or dust) generated in deposition can be reduced and the film thickness can be uniform.

Note that before the oxide semiconductor layer is formed by a sputtering method, powder substances (also referred to as particles or dust) attached to a surface over which the oxide semiconductor layer is formed are preferably removed by reverse sputtering in which an argon gas is introduced and plasma is generated. The reverse sputtering refers to a method in which voltage is applied to a substrate to generate plasma in the vicinity of the substrate so that a surface on the substrate side is modified. Note that instead of argon, a gas such as nitrogen, helium, or oxygen may be used.

The oxide semiconductor layer can be processed by being etched after a mask having a desired shape is formed over the oxide semiconductor layer. The mask can be formed by a method such as photolithography. Alternatively, a method such as an inkjet method may be used to form the mask. Note that the etching of the oxide semiconductor layer may be dry etching or wet etching. Needless to say, both of them may be employed in combination.

After that, heat treatment (first heat treatment) may be performed on the oxide semiconductor layer 144. The heat treatment further removes the substance including a hydrogen atom in the oxide semiconductor layer 144; thus, a structure of the oxide semiconductor layer 144 can be improved and defect levels in the energy gap can be reduced. The heat treatment is performed in an inert gas atmosphere at a temperature higher than or equal to 250° C. and lower than or equal to 700° C., preferably higher than or equal to 450° C. and lower than or equal to 600° C. or lower than a strain point of the substrate. The inert gas atmosphere is preferably an atmosphere which includes nitrogen or a rare gas (such as helium, neon, or argon) as a main component and does not include water, hydrogen, and the like. For example, the purity of nitrogen or a rare gas such as helium, neon, or argon introduced into a heat treatment apparatus is higher than or equal to 6N (99.9999%), preferably higher than or equal to 7N (99.99999%) (i.e., the impurity concentration is lower than or equal to 1 ppm, preferably lower than or equal to 0.1 ppm).

The heat treatment can be performed in such a manner that, for example, an object to be heated is introduced into an electric furnace in which a resistance heating element or the like is used, and heated at 450° C. for one hour in a nitrogen atmosphere. The oxide semiconductor layer 144 is not exposed to the air during the heat treatment so that entry of water and hydrogen can be prevented.

The above heat treatment can also be referred to as dehydration treatment, dehydrogenation treatment, or the like because of its effect of removing hydrogen, water, and the like. The heat treatment can be performed at the timing, for example, before the oxide semiconductor layer is processed into an island shape or after the gate insulating layer is formed. Such dehydration treatment or dehydrogenation treatment may be conducted once or plural times.

Figure 18B:
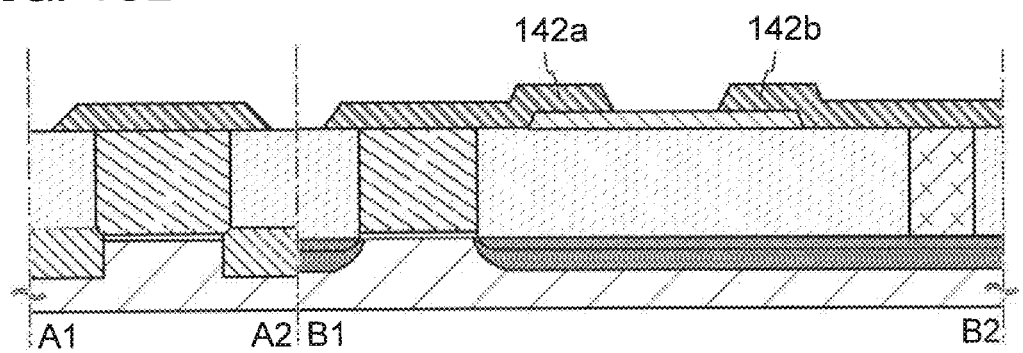

Next, a conductive layer for forming a source electrode and a drain electrode (including a wiring formed in the same layer as the source electrode and the drain electrode) is formed over the oxide semiconductor layer 144 and the like and is processed, so that the source or drain electrode 142a and the source or drain electrode 142b are formed (see FIG. 18B).

The conductive layer can be formed by a PVD method or a CVD method. As a material for the conductive layer, an element selected from aluminum, chromium, copper, tantalum, titanium, molybdenum, and tungsten; an alloy including any of these elements as a component; or the like can be used. A material including one of manganese, magnesium, zirconium, beryllium, neodymium, and scandium or a combination of any of these elements may be used.

The conductive layer may have a single-layer structure or a stacked structure including two or more layers. For example, the conductive layer can have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked, or the like. Note that in the case where the conductive layer has a single-layer structure of a titanium film or a titanium nitride film, there is an advantage in that the conductive layer is easily processed into the source or drain electrode 142a and the source or drain electrode 142b having tapered shapes.

Alternatively, the conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials including silicon or silicon oxide can be used.

The conductive layer is preferably etched so that end portions of the source or drain electrode 142a and the source or drain electrode 142b are tapered. Here, a taper angle is, for example, preferably greater than or equal to 30° and less than or equal to 60°. The etching is performed so that the end portions of the source or drain electrode 142a and the source or drain electrode 142b are tapered, whereby coverage with the gate insulating layer 146 formed later can be improved and disconnection can be prevented.

The channel length (L) of the transistor in the upper portion is determined by the distance between a lower edge portion of the source or drain electrode 142a and a lower edge portion of the source or drain electrode 142b. Note that for light exposure for forming a mask used in the case where a transistor with a channel length (L) of less than 25 nm is formed, it is preferable to use extreme ultraviolet light whose wavelength is as short as several nanometers to several tens of nanometers. In the light exposure by extreme ultraviolet light, the resolution is high and the focus depth is large. Accordingly, the channel length (L) of the transistor formed later can be greater than or equal to 10 nm and less than or equal to 1000 nm (1 μm), and the operation speed of a circuit can be increased. Moreover, miniaturization can lead to lower power consumption of the semiconductor device.

Figure 18C:
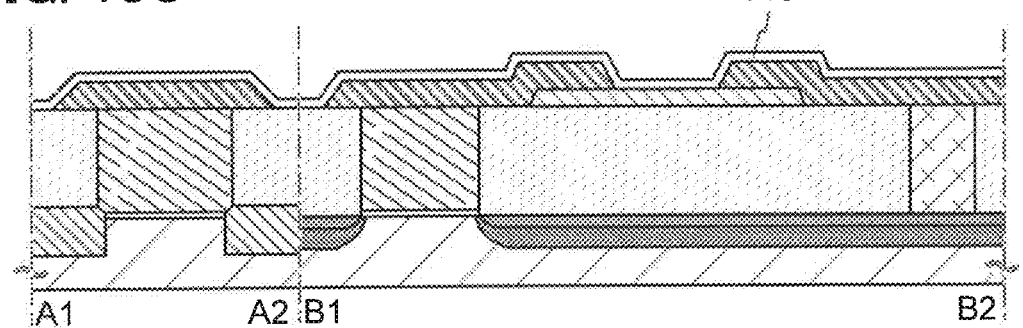

Next, the gate insulating layer 146 is formed so as to cover the source or drain electrodes 142a and 142b and to be in contact with part of the oxide semiconductor layer 144 (see FIG. 18C).

The gate insulating layer 146 can be formed by a CVD method, a sputtering method, or the like. The gate insulating layer 146 is formed using a material such as silicon oxide, silicon nitride, or silicon oxynitride. Alternatively, the gate insulating layer 146 can be formed using a material including a Group 13 element and oxygen. As the material including a Group 13 element and oxygen, for example, gallium oxide, aluminum oxide, aluminum gallium oxide, or the like can be used. Furthermore, the gate insulating layer 146 may be formed so as to include a high dielectric constant (high-k) material such as tantalum oxide, hafnium oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), or hafnium aluminate to which nitrogen is added (HfAl$_x$O$_y$N$_z$ (x>0, y>0, z>0)). The gate insulating layer 146 may have a single-layer structure or a stacked structure including a combination of any of the above materials. There is no particular limitation on the thickness; however, in the case where the semiconductor device is miniaturized, the thickness is preferably small for securing operation of the transistor. For example, in the case where silicon oxide is used, the thickness can be greater than or equal to 1 nm and less than or equal to 100 nm, preferably greater than or equal to 10 nm and less than or equal to 50 nm.

The gate insulating layer 146 is preferably formed by a method with which impurities such as hydrogen and water do not enter the gate insulating layer 146. This is because, when impurities such as hydrogen and water are included in the gate insulating layer 146, the impurities such as hydrogen and water enter the oxide semiconductor layer or oxygen in the oxide semiconductor layer is extracted by the impurities such as hydrogen and water, so that a back channel of the oxide semiconductor layer might have lower resistance (have n-type conductivity) and a parasitic channel might be formed. Therefore, the gate insulating layer 146 is preferably formed so as to include impurities such as hydrogen and water as few as possible. For example, the gate insulating layer 146 is preferably formed by a sputtering method. A high-purity gas from which impurities such as hydrogen and water are removed is preferably used as a sputtering gas used in the deposition.

Many oxide semiconductor materials that can be used for the oxide semiconductor layer 144 include a Group 13 element. Therefore, in the case where the gate insulating layer 146 in contact with the oxide semiconductor layer 144 is formed using a material including a Group 13 element and oxygen, the state of the interface between the oxide semiconductor layer 144 and the gate insulating layer 146 can be kept favorable. This is because a material including a Group 13 element and oxygen is compatible with an oxide semiconductor material. For example, when the oxide semiconductor layer 144 and the gate insulating layer 146 including gallium oxide are provided in contact with each other, pileup of hydrogen at the interface between the oxide semiconductor layer 144 and the gate insulating layer 146 can be reduced. Aluminum oxide has a property of not easily transmitting water. Thus, it is preferable to use aluminum oxide for the gate insulating layer 146 in terms of preventing entry of water into the oxide semiconductor layer 144.

When the gate insulating layer is thin as described above, a problem of gate leakage due to a tunneling effect or the like is caused. In order to solve the problem of gate leakage, the above high-k material is preferably used for the gate insulating layer 146. By using the high-k material for the gate insulating layer 146, the thickness can be increased to suppress gate leakage with electric characteristics ensured. Note that a stacked structure of a film including a high-k material and a film including any of silicon oxide, silicon nitride, silicon oxynitride, silicon nitride oxide, aluminum oxide, and the like may be employed.

In addition, the gate insulating layer 146 preferably includes oxygen more than that in the stoichiometric composition. For example, when gallium oxide is used for the gate insulating layer 146, the stoichiometric composition can be expressed as $Ga_2O_{3+\alpha}$ (0<α<1). When aluminum oxide is used, the stoichiometric composition can be expressed as $Al_2O_{3+\alpha}$ (0<α<1). When gallium aluminum oxide is used, the stoichiometric composition can be expressed as $Ga_xAl_{2-x}O_{3+\alpha}$ (0<x<2, 0<α<1).

Note that oxygen doping treatment may be performed after deposition of the oxide semiconductor layer, after formation of the oxide semiconductor layer 144, or after formation of the gate insulating layer 146. The oxygen doping refers to addition of oxygen (which includes at least one of an oxygen radical, an oxygen atom, and an oxygen ion) to a bulk. Note that the term "bulk" is used in order to clarify that oxygen is added not only to a surface of a thin film but also to the inside of the thin film. In addition, "oxygen doping" includes "oxygen plasma doping" in which oxygen that is made to be plasma is added to a bulk. By the oxygen doping treatment, oxygen can be included in the oxide semiconductor layer or the gate insulating layer more than that in the stoichiometric composition.

The oxygen doping treatment is preferably performed by an inductively coupled plasma (ICP) method with the use of oxygen plasma which is excited by a microwave (with a frequency of 2.45 GHz, for example).

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour in a nitrogen atmosphere. The second heat treatment can reduce variation in electric characteristics of the transistor. Further, in the case where the gate insulating layer 146 includes oxygen, oxygen can be supplied to the oxide semiconductor layer 144 to cover oxygen deficiency in the oxide semiconductor layer 144.

Note that in this embodiment, the second heat treatment is performed after the gate insulating layer 146 is formed; however, the timing of the second heat treatment is not limited to this. For example, the second heat treatment may be performed after a gate electrode is formed. Alternatively, the first heat treatment and the second heat treatment may be successively performed, the first heat treatment may also serve as the second heat treatment, or the second heat treatment may also serve as the first heat treatment.

By performing at least one of the first heat treatment and the second heat treatment as described above, the oxide semiconductor layer 144 can be highly purified so as to include the substance including a hydrogen atom as few as possible.

Figure 18D:
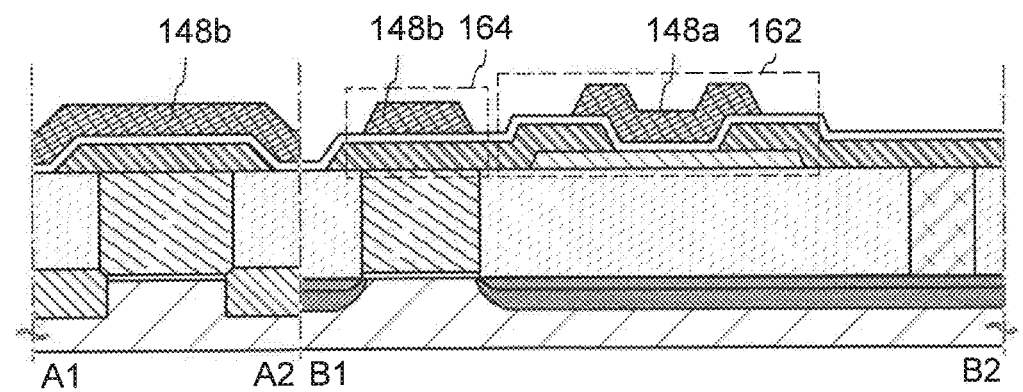

Next, a conductive layer for forming a gate electrode (including a wiring formed in the same layer as the gate electrode) is formed and processed, so that the gate electrode 148a and the conductive layer 148b are formed (see FIG. 18D).

The gate electrode 148a and the conductive layer 148b can be formed using a metal material such as molybdenum, titanium, tantalum, tungsten, aluminum, copper, neodymium, or scandium, or an alloy material including any of these materials as a main component. The gate electrode 148a and the conductive layer 148b may each have a single-layer structure or a stacked structure.

Figure 19A:
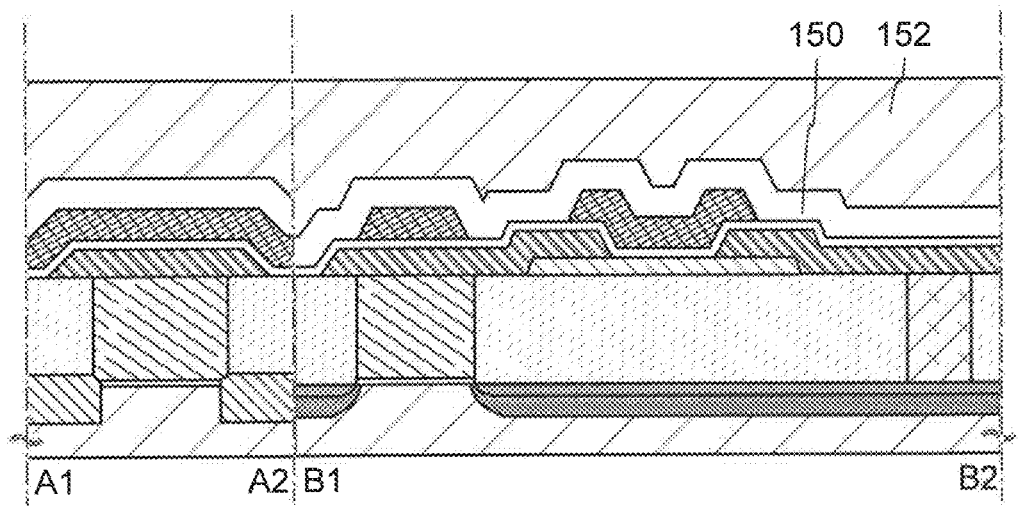
FIGS. 19A and 19B are cross-sectional views illustrating a manufacturing process of a semiconductor device.

Next, the insulating layer 150 and the insulating layer 152 are formed over the gate insulating layer 146, the gate electrode 148a, and the conductive layer 148b (see FIG. 19A). The insulating layer 150 and the insulating layer 152 can be formed by a PVD method, a CVD method, or the like. The insulating layer 150 and the insulating layer 152 can be formed using a material including an inorganic insulating material such as silicon oxide, silicon oxynitride, silicon nitride, hafnium oxide, gallium oxide, aluminum oxide, or gallium aluminum oxide. Note that the insulating layer 150 and the insulating layer 152 are preferably formed using a low dielectric constant material or to have a structure with a low dielectric constant (such as a porous structure). This is because by reducing the dielectric constant of the insulating layer 150 and the insulating layer 152, capacitance between wirings, electrodes, or the like can be reduced; thus, operation at higher speed can be achieved. Note that although the insulating layer 150 and the insulating layer 152 each have a single-layer structure in this embodiment, one embodiment of the present invention is not limited to this. The insulating layer 150 and the insulating layer 152 may each have a stacked structure including two or more layers.

Then, an opening 153 reaching the source or drain electrode 142b is formed in the gate insulating layer 146, the insulating layer 150, and the insulating layer 152. After that, the electrode 154 which is in contact with the source or drain electrode 142b is formed in the opening 153, and the wiring 156 which is in contact with the electrode 154 is formed over the insulating layer 152 (see FIG. 19B). Thus, the stack 213b can be formed. Note that the opening is formed by selective etching using a mask or the like.

The electrode 154 can be formed in such a manner that, for example, a conductive layer is formed by a PVD method, a CVD method, or the like in a region including the opening 153 and then part of the conductive layer is removed by etching treatment, CMP treatment, or the like.

Specifically, for example, it is possible to employ a method in which a thin titanium film is formed by a PVD method in a region including the opening 153 and a thin titanium nitride film is formed by a CVD method, and then a tungsten film is formed so as to be embedded in the opening 153. Here, the titanium film formed by a PVD method has a function of reducing an oxide film (such as a natural oxide film) formed on a surface over which the titanium film is formed, thereby lowering the contact resistance with a lower electrode or the like (the source or drain electrode 142b, here). The titanium nitride film formed after the formation of the titanium film has a barrier function of preventing diffusion of the conductive material. A copper film may be formed by a plating method after the formation of the barrier film of titanium, titanium nitride, or the like.

Note that in the case where the electrode 154 is formed by removing part of the conductive layer, processing is preferably performed so that the surface is planarized. For example, in the case where a thin titanium film or a thin titanium nitride film is formed in a region including the opening 153 and then a tungsten film is formed so as to be embedded in the opening 153, excessive tungsten, titanium, titanium nitride, or the like can be removed and the planarity of the surface can be improved by subsequent CMP treatment. The surface including the electrode 154 is planarized in this manner, whereby an electrode, a wiring, an insulating layer, a semiconductor layer, or the like can be favorably formed in a later step.

The wiring 156 is formed in such a manner that a conductive layer is formed by a PVD method typified by a sputtering method or a CVD method such as a plasma CVD method and then the conductive layer is patterned. As a material for the conductive layer, an element selected from aluminum, chromium, copper, tantalum, titanium, molybdenum, and tungsten; an alloy including any of these elements as a component; or the like can be used. A material including one of manganese, magnesium, zirconium, beryllium, neodymium, and scandium or a combination of any of these elements may be used. The details are similar to those of the source or drain electrodes 142a and 142b, and the like.

Figure 19B:
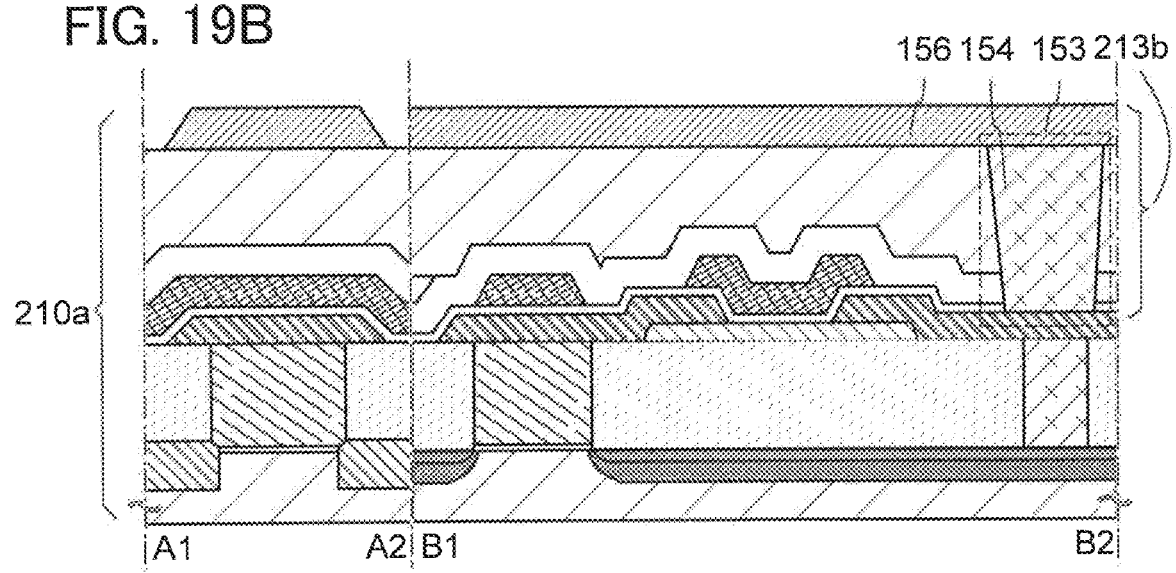

Through the above steps, the first stack 210a including the transistor 160, the transistor 162, and the capacitor 164 is completed (see FIG. 19B).

Next, the insulating layer 158 is formed over the first stack 210a, and the second stack 210b is formed over the insulating layer 158 (see FIG. 1). The second stack 210b includes the transistor 170, the transistor 172, and the capacitor 174. Here, a method for manufacturing the transistor 170, the transistor 172, and the capacitor 174 is similar to the method for manufacturing the transistor 162 and the capacitor 164, and thus is not described in detail. In the case where a third stack or a fourth stack is formed over the second stack 210b, a transistor and a capacitor which are similar to the transistor 170, the transistor 172, and the capacitor 174 may be formed with an insulating layer positioned between the second stack 210b and the transistor and the capacitor.

In a manufacturing process of a transistor including an oxide semiconductor layer, high-temperature treatment is not needed and thus the transistor can be manufactured without affecting a device or a wiring in a first stack. Further, the manufacturing process of the transistor including an oxide semiconductor layer has a smaller number of steps than a manufacturing process of a transistor including a semiconductor material (e.g., silicon) other than an oxide semiconductor. Accordingly, by using a stack formed using the transistor including an oxide semiconductor layer as a second stack or a third stack, the manufacturing cost can be reduced.

The structures, methods, and the like described in this embodiment can be combined as appropriate with any of the structures, methods, and the like described in the other embodiment.

Embodiment 2

In this embodiment, application of the semiconductor device described in the above embodiment to an electronic device will be described with reference to FIGS. 20A to 20F.

In this embodiment, examples of the electronic device to which the above semiconductor device is applied include a computer, a mobile phone (also referred to as a cellular phone or a mobile phone device), a portable information terminal (including a portable game machine, an audio reproducing device, and the like), a camera such as a digital camera or a digital video camera, electronic paper, and a television device (also referred to as a television or a television receiver).

Figure 20A:
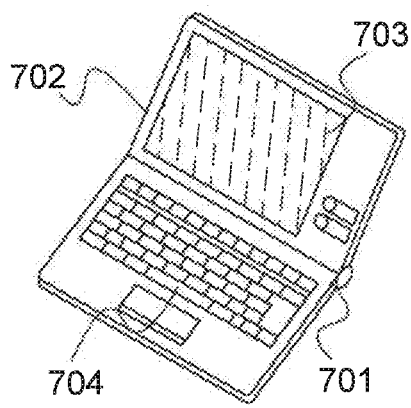
FIGS. 20A to 20F are views each illustrating an electronic device including a semiconductor device.

FIG. 20A illustrates a laptop computer including a housing 701, a housing 702, a display portion 703, a keyboard 704, and the like. A memory circuit is provided inside at least one of the housings 701 and 702, and the memory circuit includes the semiconductor device described in the above embodiment. Therefore, a laptop computer in which writing and reading of data are performed at high speed, data is held for a long time, and power consumption is sufficiently reduced can be realized.

Figure 20D:
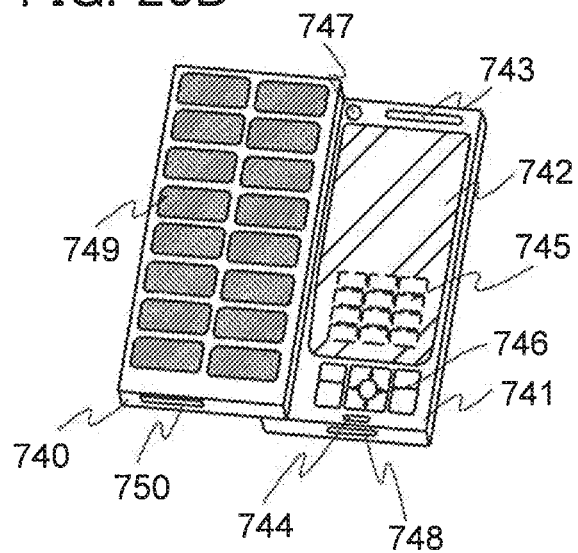
Figure 20B:
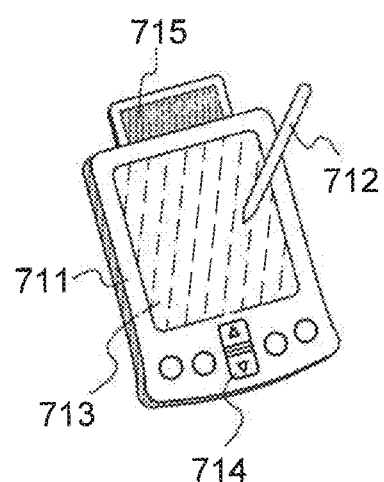

FIG. 20B illustrates a portable information terminal (PDA). A main body 711 is provided with a display portion 713, an external interface 715, an operation button 714, and the like. Further, a stylus 712 for operation of the portable information terminal, or the like is provided. A memory circuit is provided inside the main body 711, and the memory circuit includes the semiconductor device described in the above embodiment. Therefore, a portable information terminal in which writing and reading of data are performed at high speed, data is held for a long time, and power consumption is sufficiently reduced can be realized.

Figure 20E:
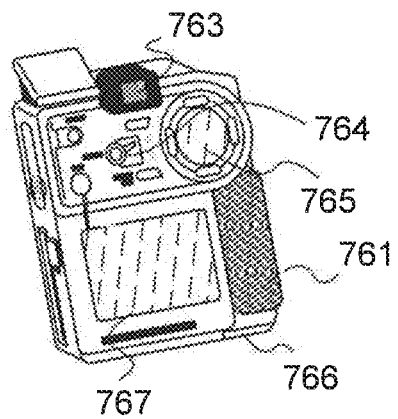
Figure 20C:
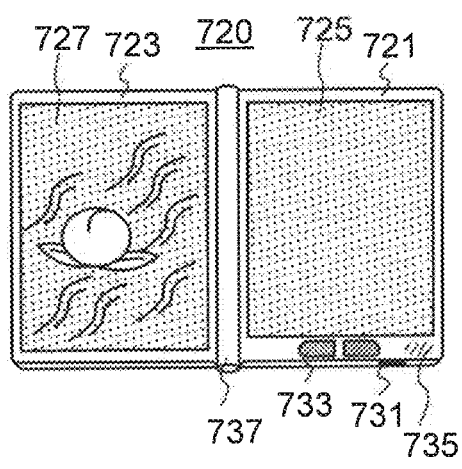

FIG. 20C illustrates an electronic book reader 720 incorporating electronic paper, which includes two housings, a housing 721 and a housing 723. The housing 721 and the housing 723 are provided with a display portion 725 and a display portion 727, respectively. The housings 721 and 723 are connected by a hinge 737 and can be opened and closed using the hinge 737 as an axis. The housing 721 is provided with a power switch 731, an operation key 733, a speaker 735, and the like. A memory circuit is provided inside at least one of the housings 721 and 723, and the memory circuit includes the semiconductor device described in the above embodiment. Therefore, an electronic book reader in which writing and reading of data are performed at high speed, data is held for a long time, and power consumption is sufficiently reduced can be realized.

FIG. 20D illustrates a mobile phone including two housings, a housing 740 and a housing 741. Further, the housing 740 and the housing 741 which are in a state where they are developed as illustrated in FIG. 20D can slide so that one is lapped over the other. Thus, the mobile phone can be made small and suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the mobile phone, an external memory slot 750, and the like. In addition, an antenna is incorporated in the housing 741. A memory circuit is provided inside at least one of the housings 740 and 741, and the memory circuit includes the semiconductor device described in the above embodiment. Therefore, a mobile phone in which writing and reading of data are performed at high speed, data is held for a long time, and power consumption is sufficiently reduced can be realized.

FIG. 20E illustrates a digital camera including a main body 761, a display portion 767, an eyepiece 763, an operation switch 764, a display portion 765, a battery 766, and the like. In the main body 761, the semiconductor device described in the above embodiment is provided. Therefore, a digital camera in which writing and reading of data are performed at high speed, data is held for a long time, and power consumption is sufficiently reduced can be realized.

Figure 20F:
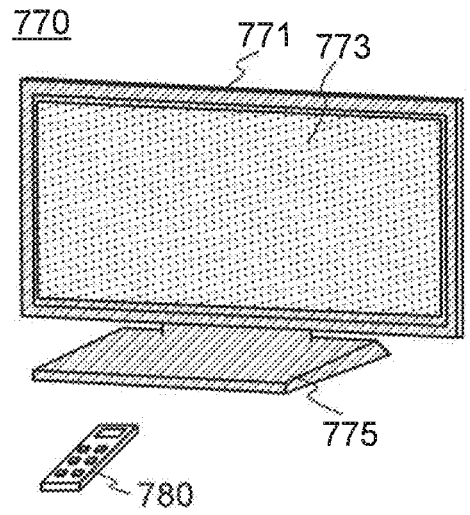

FIG. 20F illustrates a television set 770 including a housing 771, a display portion 773, a stand 775, and the like. The television set 770 can be operated with a switch of the housing 771 or a remote controller 780. A memory circuit is provided inside the housing 771 and the remote controller 780, and the memory circuit includes the semiconductor device described in the above embodiment. Therefore, a television set in which writing and reading of data are performed at high speed, data is held for a long time, and power consumption is sufficiently reduced can be realized.

As described above, the electronic devices described in this embodiment each include the semiconductor device according to the above embodiment. Therefore, electronic devices with low power consumption can be realized.

EXPLANATION OF REFERENCE

100: substrate, 102: protective layer, 104: semiconductor region, 106: element isolation insulating layer, 108: gate insulating layer, 110: gate electrode, 116: channel formation region, 120: impurity region, 122: metal layer, 124: metal compound region, 126: electrode, 128: insulating layer, 142a: source or drain electrode, 142b: source or drain electrode, 144: oxide semiconductor layer, 146: gate insulating layer, 148a: gate electrode, 148b: conductive layer, 150: insulating layer, 152: insulating layer, 153: opening, 154: electrode, 156: wiring, 158: insulating layer, 160: transistor, 162: transistor, 164: capacitor, 170: transistor, 172: transistor, 174: capacitor, 201: memory cell array, 202: first driver circuit, 203: second driver circuit, 210a: first stack, 210b: second stack, 210c: third stack, 211a: memory cell array, 211b: memory cell array, 211c: memory cell array, 212a: memory cell, 212b: memory cell, 212c: memory cell, 213a: stack, 213b: stack, 213c: stack, 213d: stack, 221: selector, 221a: selector, 221b: selector, 221c: selector, 222: circuit, 223: row decoder, 231: selector, 231a: selector, 231b: selector, 231c: selector, 232: circuit group, 232a: circuit group, 232b: circuit group, 233: column decoder, 234: circuit group, 235: circuit group, 236: register group, 237: circuit, 238: circuit, 239: register, 701: housing, 702: housing, 703: display portion, 704: keyboard, 711: main body, 712: stylus, 713: display portion, 714: operation button, 715: external interface, 720: electronic book reader, 721: housing, 723: housing, 725: display portion, 727: display portion, 731: power switch, 733: operation key, 735: speaker, 737: hinge, 740: housing, 741: housing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television set, 771: housing, 773: display portion, 775: stand, and 780: remote controller.

This application is based on Japanese Patent Application serial no. 2010-152021 filed with the Japan Patent Office on Jul. 2, 2010, the entire contents of which are hereby incorporated by reference.

The invention claimed is:

1. A semiconductor device comprising:
   a driver circuit comprising a first transistor, the first transistor comprising a channel formation region comprising single crystal silicon;
   a first insulating layer over the first transistor;

a second transistor over the first insulating layer;
a second insulating layer over the second transistor; and
a third transistor over the second insulating layer,
    wherein each of the second transistor and the third transistor comprises an oxide semiconductor layer having a channel formation region,
    wherein a top surface of a gate electrode of the second transistor directly contacts a bottom surface of one of a source electrode and a drain electrode of the third transistor, and
    wherein the second transistor and the third transistor are at least partially overlapped with each other.

2. The semiconductor device according to claim 1, wherein one of a source electrode and a drain electrode of the second transistor is electrically connected to the other of the source electrode and the drain electrode of the third transistor.

3. The semiconductor device according to claim 1, wherein the driver circuit comprises a selector circuit.

4. The semiconductor device according to claim 1, wherein the channel formation region of the first transistor is formed in a single crystal silicon substrate.

5. The semiconductor device according to claim 1, wherein the oxide semiconductor layer comprises indium.

6. The semiconductor device according to claim 1, wherein the oxide semiconductor layer contains hydrogen at a concentration lower than or equal to $5\times10^{19}$ atoms/cm$^3$.

7. The semiconductor device according to claim 1, wherein the second transistor and the third transistor are included in a memory cell.

8. The semiconductor device according to claim 1, wherein a gate electrode of the first transistor is electrically connected to a capacitor provided over the first transistor.

9. The semiconductor device according to claim 1, wherein the gate electrode of the second transistor is electrically connected to a capacitor provided over the second transistor.

10. The semiconductor device according to claim 1, wherein the top surface of the gate electrode of the second transistor and a top surface of the second insulating layer are on a same plane.

11. The semiconductor device according to claim 1, wherein the one of the source electrode and the drain electrode of the third transistor is provided over and in contact with the top surface of the gate electrode of the second transistor and a top surface of the second insulating layer.

12. A semiconductor device comprising:
    a first transistor comprising a channel formation region comprising single crystal silicon;
    a first insulating layer over the first transistor;
    a second transistor over the first insulating layer;
    a second insulating layer over the second transistor; and
    a third transistor over the second insulating layer,
    wherein each of the second transistor and the third transistor comprises an oxide semiconductor layer having a channel formation region,
    wherein a top surface of a gate electrode of the second transistor directly contacts a bottom surface of one of a source electrode and a drain electrode of the third transistor, and
    wherein the second transistor and the third transistor are at least partially overlapped with each other.

13. The semiconductor device according to claim 12, wherein one of a source electrode and a drain electrode of the second transistor is electrically connected to the other of the source electrode and the drain electrode of the third transistor.

14. The semiconductor device according to claim 12, wherein the channel formation region of the first transistor is formed in a single crystal silicon substrate.

15. The semiconductor device according to claim 12, wherein the oxide semiconductor layer comprises indium.

16. The semiconductor device according to claim 12, wherein the oxide semiconductor layer contains hydrogen at a concentration lower than or equal to $5\times10^{19}$ atoms/cm$^3$.

17. The semiconductor device according to claim 12, wherein the second transistor and the third transistor are included in a memory cell.

18. The semiconductor device according to claim 12, wherein a gate electrode of the first transistor is electrically connected to a capacitor provided over the first transistor.

19. The semiconductor device according to claim 12, wherein the gate electrode of the second transistor is electrically connected to a capacitor provided over the second transistor.

20. The semiconductor device according to claim 12, wherein the top surface of the gate electrode of the second transistor and a top surface of the second insulating layer are on a same plane.

21. The semiconductor device according to claim 12, wherein the one of the source electrode and the drain electrode of the third transistor is provided over and in contact with the top surface of the gate electrode of the second transistor and a top surface of the second insulating layer.

* * * * *